(12) United States Patent
Matsumoto et al.

(10) Patent No.: US 11,978,755 B2
(45) Date of Patent: May 7, 2024

(54) SEMICONDUCTOR APPARATUS AND EQUIPMENT

(71) Applicant: CANON KABUSHIKI KAISHA, Tokyo (JP)

(72) Inventors: Kohei Matsumoto, Tokyo (JP); Hideo Kobayashi, Tokyo (JP); Daisuke Yoshida, Ebina (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 607 days.

(21) Appl. No.: 16/905,358

(22) Filed: Jun. 18, 2020

(65) Prior Publication Data

US 2020/0403019 A1    Dec. 24, 2020

(30) Foreign Application Priority Data

Jun. 24, 2019   (JP) ................................. 2019-116386

(51) Int. Cl.
*H01L 27/146*    (2006.01)
*H01L 23/00*     (2006.01)

(52) U.S. Cl.
CPC ........ *H01L 27/14634* (2013.01); *H01L 24/08* (2013.01); *H01L 27/14636* (2013.01); *H01L 2224/08145* (2013.01)

(58) Field of Classification Search
None
See application file for complete search history.

(56) References Cited

U.S. PATENT DOCUMENTS

| | | | |
|---|---|---|---|
| 9,165,974 B2* | 10/2015 | Kim | .................... H01L 27/1464 |
| 2006/0023109 A1 | 2/2006 | Mabuchi | |
| 2011/0157445 A1 | 6/2011 | Itonaga | |
| 2012/0199930 A1 | 8/2012 | Hayashi | |
| 2012/0235270 A1 | 9/2012 | Wayama | |
| 2013/0107091 A1 | 5/2013 | Teshima | |
| 2013/0141617 A1 | 6/2013 | Soda | |
| 2013/0285180 A1 | 10/2013 | Wang et al. | |
| 2014/0077057 A1 | 3/2014 | Chao | |
| 2015/0279889 A1* | 10/2015 | Chen | ................... H01L 27/1464 |
| | | | 257/777 |

(Continued)

FOREIGN PATENT DOCUMENTS

| CN | 102683367 A | 9/2012 |
|---|---|---|
| CN | 102782840 A | 11/2012 |

(Continued)

*Primary Examiner* — Nishath Yasmeen
(74) *Attorney, Agent, or Firm* — CANON U.S.A., INC. IP Division

(57) ABSTRACT

A semiconductor apparatus according to the present invention includes: a semiconductor component including a cell array and a plurality of wirings; and a semiconductor component including a plurality of pads connected to the semiconductor component including the cell array. A first row pad connected to a row wiring connected to a first cell and a second cell, a second row pad connected to a row wiring connected to a third cell and a fourth cell, and a column pad connected to a column wiring connected to the first cell and the third cell are arranged such that a straight line connecting the first row pad and the column pad crosses a straight line connecting the second row pad and the column pad.

24 Claims, 16 Drawing Sheets

(56) References Cited

U.S. PATENT DOCUMENTS

| | | |
|---|---|---|
| 2016/0284753 A1 | 9/2016 | Komai |
| 2017/0047339 A1 | 2/2017 | Cernea |
| 2017/0186798 A1* | 6/2017 | Yang ................. H01L 27/14632 |
| 2017/0257587 A1* | 9/2017 | Hatano ................ H04N 25/778 |
| 2017/0309667 A1* | 10/2017 | Yamashita ........ H01L 27/14643 |
| 2018/0166490 A1 | 6/2018 | Wakiyama |
| 2018/0350858 A1 | 12/2018 | Oishi et al. |
| 2019/0103434 A1* | 4/2019 | Kobayashi ............. H04N 25/79 |
| 2019/0371841 A1* | 12/2019 | Yamashita ........ H01L 27/14641 |
| 2022/0165767 A1* | 5/2022 | Fujii .................... H01L 21/768 |

FOREIGN PATENT DOCUMENTS

| | | |
|---|---|---|
| CN | 106409852 A | 2/2017 |
| JP | 2010129842 A | 6/2010 |
| JP | 2010-225927 A | 10/2010 |
| JP | 2012-104684 A | 5/2012 |
| JP | 2013-051674 A | 3/2013 |
| JP | 2013-090127 A | 5/2013 |
| JP | 2013-145907 A | 7/2013 |
| JP | 2013-255125 A | 12/2013 |
| JP | 2018182038 A | 11/2018 |
| JP | 2019-028062 | * 2/2019 |
| JP | 2019028062 A | 2/2019 |

\* cited by examiner

FIG. 6C

|     | N-2 | N-1 | N | N+1 | N+2 | N+3 | N+4 | N+5 | N+6 |
|-----|-----|-----|---|-----|-----|-----|-----|-----|-----|
| M+9 |     |     | r | s   | t   |     |     |     |     |
| M+8 |     |     | r | s   | t   |     |     |     |     |
| M+7 |     |     | r | s   | t   |     |     |     |     |
| M+6 |     |     | r | s   | t   |     |     |     |     |
| M+5 |     |     | r | s   | t   |     |     |     |     |
| M+4 |     |     | r | s   | t   |     |     |     |     |
| M+3 |     |     | r | s   | t   |     |     |     |     |
| M+2 |     |     | r | s   | t   |     |     |     |     |
| M+1 |     |     | r | s   | t   | o   | o   | o   |     |
| M   | o   | o   | o | o   | o   | r   | s   | t   | o   |
| M-1 |     |     | r | s   | t   |     |     |     |     |
| M-2 |     |     | r | s   | t   |     |     |     |     |

FIG. 7C

|     | N-2 | N-1 | N | N+1 | N+2 | N+3 | N+4 | N+5 | N+6 |
|-----|-----|-----|---|-----|-----|-----|-----|-----|-----|
| M+9 |     |     | r | s   | t   |     |     |     |     |
| M+8 |     |     | r | s   | t   |     |     |     |     |
| M+7 |     |     | r | s   | t   |     |     |     |     |
| M+6 |     |     | r | s   | t   |     |     |     | o   |
| M+5 |     |     | r | s   | t   |     |     | o   |     |
| M+4 |     |     | r | s   | t   |     | o   |     |     |
| M+3 |     |     | r | s   | t   | o   |     |     |     |
| M+2 |     |     | r | s   | o   | t   |     |     |     |
| M+1 |     |     | r | o   | s   | t   |     |     |     |
| M   |     |     | o | r   | s   | t   |     |     |     |
| M-1 |     | o   | r | s   | t   |     |     |     |     |
| M-2 | o   |     | r | s   | t   |     |     |     |     |

FIG. 8C

|       | N-2 | N-1 | N | N+1 | N+2 | N+3 | N+4 | N+5 | N+6 |
|-------|-----|-----|---|-----|-----|-----|-----|-----|-----|
| M+9   |     |     | r | s   | t   |     |     |     |     |
| M+8   |     |     | r | s   | t   |     |     |     |     |
| M+7   |     |     | r | s   | t   |     |     |     |     |
| M+6   |     |     | r | s   | t   |     |     |     |     |
| M+5   |     |     | r | s   | t   |     |     |     |     |
| M+4   |     |     | r | s   | t   |     |     |     |     |
| M+3   |     |     | r | s   | t   | a   | a   | a   | a   |
| M+2   |     |     | r | s   | t   | b   | b   | b   | b   |
| M+1   | a   | a   | a | a   | a   | r   | s   | t   |     |
| M     | b   | b   | b | b   | b   | r   | s   | t   |     |
| M-1   |     |     | r | s   | t   |     |     |     |     |
| M-2   |     |     | r | s   | t   |     |     |     |     |

FIG. 9C

|      | N | N+1 | N+2 | N+3 | N+4 | N+5 | N+6 | N+7 | N+8 | N+9 | N+10 | N+11 | N+12 |
|------|---|-----|-----|-----|-----|-----|-----|-----|-----|-----|------|------|------|
| M+12 |   |     | f   | e   | d   | r   | s   | t   | f   | e   | d    |      |      |
| M+11 |   | f   | e   | d   | r   | s   | t   | f   | e   | d   |      |      |      |
| M+10 | f | e   | d   | r   | s   | t   | f   | e   | d   |     |      |      | f    |
| M+9  | e | d   | r   | s   | t   | c   | e   | d   |     |     |      | c    | e    |
| M+8  | d | r   | s   | t   | c   | b   | d   |     |     |     | c    | b    | d    |
| M+7  | r | s   | t   | c   | b   | a   |     |     |     | c   | b    | a    |      |
| M+6  |   |     | c   | b   | a   | r   | s   | t   | c   | b   | a    |      |      |
| M+5  |   | c   | b   | a   | r   | s   | t   | c   | b   | a   |      |      |      |
| M+4  | c | b   | a   | r   | s   | t   | c   | b   | a   |     |      |      | c    |
| M+3  | b | a   | r   | s   | t   | f   | b   | a   |     |     |      | f    | b    |
| M+2  | a | r   | s   | t   | f   | e   | a   |     |     |     | f    | e    | a    |
| M+1  | r | s   | t   | f   | e   | d   |     |     |     | f   | e    | d    |      |

FIG. 10C

|       | N | N+1 | N+2 | N+3 | N+4 | N+5 | N+6 | N+7 | N+8 | N+9 | N+10 | N+11 | N+12 |
|-------|---|-----|-----|-----|-----|-----|-----|-----|-----|-----|------|------|------|
| M+12  | r | f   | s   | f   | t   | f   |     | f   |     | f   |      | f    |      |
| M+11  | f | r   | f   | s   | f   | t   | f   |     | f   |     | f    |      | f    |
| M+10  | r | e   | s   | e   | t   | e   |     | e   |     | e   |      | e    |      |
| M+9   | e | r   | e   | s   | e   | t   | e   |     | e   |     | e    |      | e    |
| M+8   | r | d   | s   | d   | t   | d   |     | d   |     | d   |      | d    |      |
| M+7   | d | r   | d   | s   | d   | t   | d   |     | d   |     | d    |      | d    |
| M+6   | r | c   | s   | c   | t   | c   |     | c   |     | c   |      | c    |      |
| M+5   | c | r   | c   | s   | c   | t   | c   |     | c   |     | c    |      | c    |
| M+4   | r | b   | s   | b   | t   | b   |     | b   |     | b   |      | b    |      |
| M+3   | b | r   | b   | s   | b   | t   | b   |     | b   |     | b    |      | b    |
| M+2   | r | a   | s   | a   | t   | a   |     | a   |     | a   |      | a    |      |
| M+1   | a | r   | a   | s   | a   | t   | a   |     | a   |     | a    |      | a    |

SEMICONDUCTOR APPARATUS AND EQUIPMENT

BACKGROUND OF THE INVENTION

Field of the Invention

The present invention relates to a semiconductor apparatus including a plurality of semiconductor components.

Description of the Related Art

If a semiconductor component including a cell array overlaps with another semiconductor component that is electrically connected to the cell array, the semiconductor apparatus can have a higher performance, can be downsized, or can have a higher degree of integration.

Japanese Patent Application Laid-Open No. 2010-225927 discloses a solid state imaging device in which a first chip including a plurality of pixels and a second chip including a plurality of pixel driving circuits and stacked over the first chip are electrically connected to each other via connection pads.

The study of arrangement of the connection pads is not sufficient in Japanese Patent Application Laid-Open No. 2010-225927, and characteristics of wiring between the chips and the yield rate need to be improved.

SUMMARY OF THE INVENTION

The present invention provides a technology advantageous in increasing the value as a semiconductor apparatus.

According to a first aspect of the present invention, there is provided a semiconductor apparatus including: a first semiconductor component including a cell array and a plurality of wirings; and a second semiconductor component including a plurality of pads connected to the first semiconductor component. The first semiconductor component and the second semiconductor component overlap with each other. The cell array includes a plurality of cells arranged in a first direction and a second direction that crosses the first direction. The plurality of pads is arranged on a plane along the first direction and the second direction to overlap with the cell array. The plurality of cells includes a first cell, a second cell that is arranged next to the first cell in the first direction, a third cell that is arranged next to the first cell in the second direction, and a fourth cell that is arranged next to the third cell in the first direction and next to the second cell in the second direction. The plurality of wirings includes a first wiring connected to the first cell and the second cell, a second wiring connected to the third cell and the fourth cell, and a third wiring connected to the first cell and the third cell. The plurality of pads includes a first pad connected to the first wiring, a second pad connected to the second wiring, and a third pad connected to the third wiring. The first pad, the second pad, and the third pad are arranged such that a straight line connecting the first pad and the third pad crosses a straight line connecting the second pad and the third pad.

According to a second aspect of the present invention, there is provided semiconductor apparatus including: a first semiconductor component including a cell array and a plurality of wirings; and a second semiconductor component including a pad array connected to the first semiconductor component. The first semiconductor component and the second semiconductor component overlap with each other. The cell array includes a plurality of cells arranged in matrix. The pad array includes a plurality of pads arranged in matrix to overlap with the cell array. The plurality of wirings includes a plurality of row wirings each connected to two or more cells in the same cell row of the cell array and provided in a corresponding cell row of the cell array, and a plurality of column wirings each connected to two or more cells in the same cell column of the cell array and provided in a corresponding cell column of the cell array. A first row pad connected to a first row wiring among the plurality of row wirings and a second row pad connected to a second row wiring among the plurality of row wirings are arranged in different pad columns of the pad array.

Further features of the present invention will become apparent from the following description of exemplary embodiments with reference to the attached drawings.

BRIEF DESCRIPTION OF THE DRAWINGS

FIG. 6C schematically illustrates the semiconductor apparatus according to the first example.

FIG. 7C schematically illustrates the semiconductor apparatus according to the second example.

FIG. 8C schematically illustrates the semiconductor apparatus according to the third example.

FIG. 9C schematically illustrates the semiconductor apparatus according to the fourth example.

FIG. 10C schematically illustrates the semiconductor apparatus according to the fifth example.

DESCRIPTION OF THE EMBODIMENTS

Figure 1A:
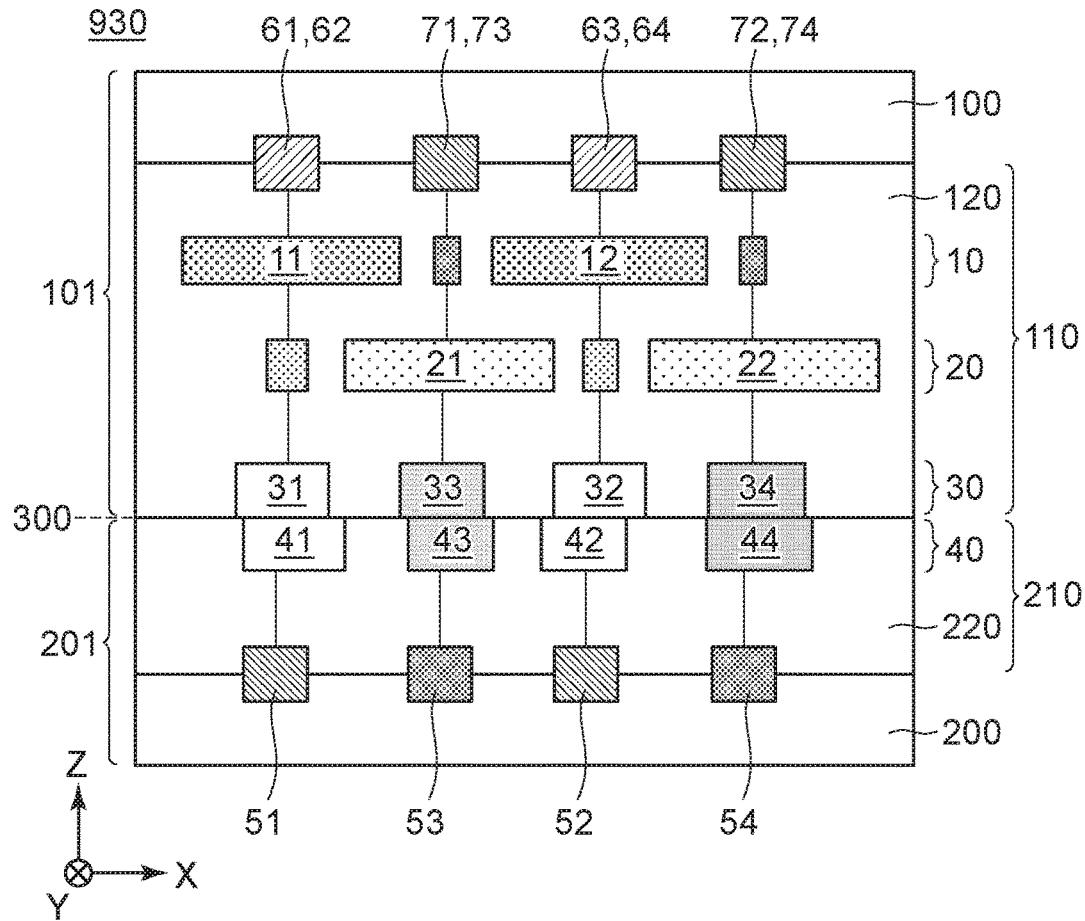
FIG. 1A schematically illustrates a semiconductor apparatus.

Hereinafter, embodiments for implementing the present invention will be described with reference to the drawings. In the following description and in the drawings, components that are common across a plurality of drawings are given common reference numerals. Thus, such common components are described by cross-referencing drawings, and description of components given common reference numerals will be omitted as appropriate.

Figure 1B:
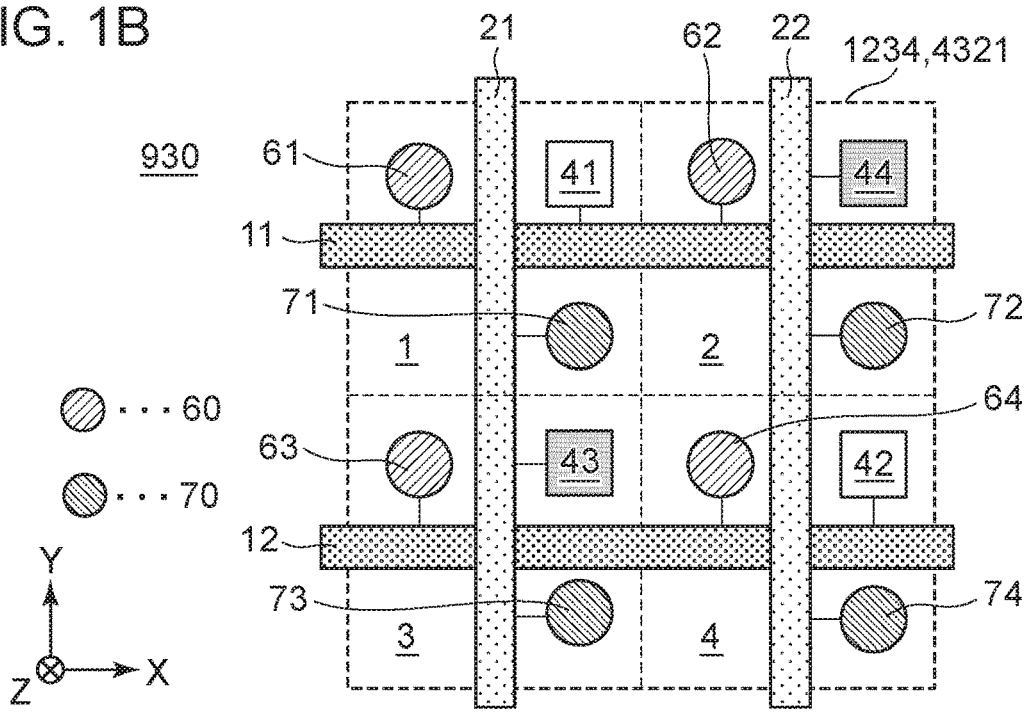
FIG. 1B schematically illustrates the semiconductor apparatus.

FIG. 1A is a schematic sectional view of a semiconductor apparatus 930, and FIG. 1B is a schematic plan view of the semiconductor apparatus 930. As illustrated in FIG. 1A, the semiconductor apparatus 930 includes a semiconductor component 101 and a semiconductor component 201. The semiconductor component 101 includes a semiconductor layer 100 and a wiring structure 110 over the semiconductor layer 100. The wiring structure 110 of the semiconductor component 101 includes a plurality of conductive layers, including a conductive layer 10, a conductive layer 20, and a conductive layer 30, and an insulating member 120 in the periphery of the plurality of conductive layers. The semiconductor component 201 includes a semiconductor layer 200 and a wiring structure 210 over the semiconductor layer 200. The wiring structure 210 of the semiconductor component 201 includes a plurality of conductive layers, including a conductive layer 40, and an insulating member 220 in the periphery of the plurality of conductive layers. In this example, the semiconductor component 101 and the semiconductor component 201 are bonded to each other at a bonding surface 300.

As illustrated in FIG. 1B, the semiconductor component 101 includes a cell array 1234. The cell array 1234 extends in the X-direction and the Y-direction. The Y-direction crosses the X-direction. Although the Y-direction is orthogonal to the X-direction in this example, the Y-direction may be oblique to the X-direction.

As illustrated in FIG. 1A, the semiconductor component 201 overlaps with the semiconductor component 101 in the Z-direction. The Z-direction crosses the X-direction and the Y-direction. Although the Z-direction is orthogonal to the X-direction and the Y-direction in this example, the Z-direction may be oblique to the X-direction and the Y-direction.

As illustrated in FIG. 1B, the cell array 1234 includes a cell 1, a cell 2, a cell 3, and a cell 4. The cell 1 and the cell 2 are arranged side by side in the X-direction. The cell 1 and the cell 3 are arranged side by side in the Y-direction. The cell 3 and the cell 4 are arranged side by side in the X-direction. The cell 2 and the cell 4 are arranged side by side in the Y-direction. A group of a plurality of cells arranged in the X-direction will be referred to as cell row, and a group of a plurality of cells arranged in the Y-direction will be referred to as a cell column.

Each of the cells in the cell array 1234 includes at least one semiconductor element. The semiconductor element herein is typically a transistor and may also be a diode or a thyristor. In addition, the semiconductor element is not limited to an active element and may be a passive element such as a resistor or a capacitor. The cell 1 includes a semiconductor element 61, the cell 2 includes a semiconductor element 62, the cell 3 includes a semiconductor element 63, and the cell 4 includes a semiconductor element 64. The semiconductor elements 61, 62, 63, and 64 may have substantially equivalent functions. The cell 1 further includes a semiconductor element 71, the cell 2 further includes a semiconductor element 72, the cell 3 further includes a semiconductor element 73, and the cell 4 further includes a semiconductor element 74. The semiconductor elements 71, 72, 73, and 74 may have, but are not limited to, substantially equivalent functions. The semiconductor elements 61, 62, 63, and 64 may have, but are not limited to, different functions from the semiconductor elements 71, 72, 73, and 74.

The semiconductor component 101 includes a plurality of wirings. A wiring that connects at least two cells included in the same cell row will be referred to as a row wiring, and a wiring that connects at least two cells included in the same cell column will be referred to as a column wiring. A plurality of wirings composed of row wirings and column wirings will be referred to as a matrix wiring. A plurality of wirings (matrix wiring) of the semiconductor component 101 includes a row wiring 11, a row wiring 12, a column wiring 21, and a column wiring 22. The row wiring 11 is connected to the cell 1 and the cell 2. The row wiring 12 is connected to the cell 3 and the cell 4. The column wiring 21 is connected to the cell 1 and the cell 3. The column wiring 22 is connected to the cell 2 and the cell 4. The column wiring 22 may also be connected to the cell 2 and, instead of the cell 4, another cell that is arranged next to the cell 2 in the Y-direction. That is, a certain cell row includes the cells 1 and 2 that are connected via the row wiring 11, and another cell row includes the cells 3 and 4 that are connected via the row wiring 12. In addition, a certain cell column includes the cells 1 and 3 that are connected via the column wiring 21, and another cell column includes the cells 2 and 4 that are connected via the column wiring 22.

The connection between a cell and a wiring will be described in more detail. The row wiring 11 is shared by the semiconductor element 61 of the cell 1 and the semiconductor element 62 of the cell 2. The row wiring 12 is shared by the semiconductor element 63 of the cell 3 and the semiconductor element 64 of the cell 4. The column wiring 21 is shared by the semiconductor element 71 of the cell 1 and the semiconductor element 73 of the cell 3. The column wiring 22 is shared by the semiconductor element 72 of the cell 2 and the semiconductor element 74 of the cell 4.

For example, a common signal is input to the semiconductor elements 61 and 62 through the row wiring 11, and a common signal is input to the semiconductor elements 63 and 64 through the row wiring 12. In addition, for example, signals from the semiconductor elements 71 and 73 are output to the column wiring 21, and signals from the semiconductor elements 72 and 74 are output to the column wiring 22. In the following description, a signal is input to a cell through a row wiring, and a signal from a cell is output to a column wiring for convenience. However, a signal may be input to a cell through a column wiring, and a signal from a cell may be output to a row wiring.

The semiconductor component 201 includes a pad array 4321. In the pad array 4321, a large number of conductive pads are arranged in an X-Y plane. The pad array 4321 includes a plurality of conductive pads arranged to overlap with the cell array 1234 in an X-Y plane. Each of the plurality of conductive pads arranged to overlap with the cell array 1234 in an X-Y plane will be referred to as an overlapping pad. The large number of conductive pads in the pad array 4321 may include, in addition to a plurality of overlapping pads that are arranged to overlap with the cell array 1234 in an X-Y plane, at least one non-overlapping pad arranged not to overlap with the cell array 1234. All of the conductive pads in the pad array 4321 may be arranged to overlap with the cell array 1234.

The plurality of overlapping pads in the semiconductor component 201 includes a row pad 41, a row pad 42, a column pad 43, and a column pad 44. The row pad 41, the row pad 42, the column pad 43, and the column pad 44 are arranged to overlap with the cell array 1234 in the Z-direction in which the semiconductor component 101 and the semiconductor component 201 overlap with each other. The row pad 41 is connected to the row wiring 11. The row pad 42 is connected to the row wiring 12. The column pad 43 is connected to the column wiring 21. The column pad 44 is connected to the column wiring 22. The row pad 41 and the column pad 43 may be arranged side by side in one of the X-direction and the Y-direction (in the Y-direction in this example). In addition, the row pad 42 and the column pad 44 may be arranged side by side in the other of the X-direction and the Y-direction (in the X-direction in this example). However, since the plurality of pads of the pad array can be arranged independently of the arrangement of the cells of the cell array, the pads are not necessarily arranged in the direction in which the cells are arranged, and, for example, the row pads and the column pads may be arranged obliquely to the cell columns and the cell rows.

More specifically, the semiconductor component 201 includes a circuit 51, a circuit 52, a circuit 53, and a circuit 54. The row pad 41 is connected to the circuit 51, the row pad 42 is connected to the circuit 52, the column pad 43 is connected to the circuit 53, and the column pad 44 is connected to the circuit 54.

The semiconductor component 101 includes a pad array. In the pad array, a large number of conductive pads are arranged in an X-Y plane. The pad array includes a plurality of conductive pads arranged to overlap with the cell array 1234 in an X-Y plane. Each of the plurality of conductive pads arranged to overlap with the cell array 1234 in an X-Y plane will be referred to as an overlapping pad. The large number of conductive pads in the pad array may include, in addition to a plurality of overlapping pads that are arranged to overlap with the cell array 1234 in an X-Y plane, at least one non-overlapping pad arranged not to overlap with the cell array 1234. All of the conductive pads in the pad array may be arranged to overlap with the cell array 1234.

The plurality of overlapping pads in the semiconductor component 101 includes a row pad 31, a row pad 32, a column pad 33, and a column pad 34. The row pad 31, the row pad 32, the column pad 33, and the column pad 34 are arranged to overlap with the cell array 1234 in the Z-direction in which the semiconductor component 101 and the semiconductor component 201 overlap with each other. The row pad 31 is connected to the row wiring 11. The row pad 32 is connected to the row wiring 12. The column pad 33 is connected to the column wiring 21. The column pad 34 is connected to the column wiring 22.

The row pad 31 and the row pad 41 are electrically connected to each other, the row pad 32 and the row pad 42 are electrically connected to each other, the column pad 33 and the column pad 43 are electrically connected to each other, and the column pad 34 and the column pad 44 are electrically connected to each other. As a result, as described above, the row pad 41 is connected to the row wiring 11, the row pad 42 is connected to the row wiring 12, the column pad 43 is connected to the column wiring 21, and the column pad 44 is connected to the column wiring 22. In addition, the circuit 51 is connected to the row wiring 11 via the row pad 41 and the row pad 31, and the circuit 52 is connected to the row wiring 12 via the row pad 42 and the row pad 32. Furthermore, the circuit 53 is connected to the column wiring 21 via the column pad 43 and the column pad 33, and the circuit 54 is connected to the column wiring 22 via the column pad 44 and the column pad 34.

In this example, the row pads 41 and 42 and column pads 43 and 44 are directly bonded to the corresponding row pads 31 and 32 and column pads 33 and 34, respectively, at the bonding surface 300. The row pads 41 and 42 and column pads 43 and 44 and the row pads 31 and 32 and column pads 33 and 34 may be bonded by a metallic bond. Materials of conductive pads appropriate for such direct bonding by a metallic bond include copper, gold, and an alloy thereof, or may be any conductive material other than copper or gold. Alternatively, bumps such as solder may be provided between the row pads 41 and 42 and column pads 43 and 44 and the row pads 31 and 32 and column pads 33 and 34, and the row pads 41 and 42 and column pads 43 and 44 and the row pads 31 and 32 and column pads 33 and 34 may be bonded via the bumps. In this example, the insulating member 120 of the wiring structure 110 is directly bonded to the insulating member 220 of the wiring structure 210 at the bonding surface 300. The insulating member 120 and the insulating member 220 may be bonded by a covalent bond. Materials of insulating members appropriate for such direct bonding by a covalent bond include silicon oxide and silicon nitride, or may be any insulating material other than silicon oxide or silicon nitride. Alternatively, an adhesive such as a resin may be provided between the insulating member 120 and the insulating member 220, and the insulating member 120 and the insulating member 220 may be bonded with the adhesive.

The pad array 4321 may include a dummy pad that is not connected to the circuits in the semiconductor component 201 or the circuits in the semiconductor component 101. The dummy pad included in the pad array 4321 may be bonded to a dummy pad included in a pad array in the semiconductor component 101. Providing a dummy pad is advantageous in increasing the uniformity of the bonding surface 300 and mechanical and/or electrical reliability of bonding between components.

This embodiment has a feature in the arrangement of the row pads 41 and 42 and the column pads 43 and 44. Since the row pads 31 and 32 are bonded to the row pads 41 and 42, the arrangement of the row pads 31 and 32 is substantially the same as the arrangement of the row pads 41 and 42. In addition, since the column pads 33 and 34 are bonded to the column pads 43 and 44, the arrangement of the column pads 33 and 34 is substantially the same as the arrangement of the column pads 43 and 44. Thus, description of the arrangement of the row pads 31 and 32 and the column pads 33 and 34 will be omitted.

The row pad 41, the row pad 42, and the column pad 43 are arranged such that a straight line A connecting (passing through) the row pad 41 and the column pad 43 crosses straight line B connecting (passing through) the row pad 42 and the column pad 43 in an X-Y plane perpendicular to the Z-direction. The row pad 41, the row pad 42, and the column pad 44 are arranged such that straight line C connecting (passing through) the row pad 41 and the column pad 44 crosses straight line D connecting (passing through) the row pad 42 and the column pad 44 in an X-Y plane perpendicular to the Z-direction. It should be noted that each of straight lines A, B, C, and D is a straight line connecting (passing through) a row pad connected to a row wiring and a column pad connected to a column wiring. In addition, it should also be noted that the row wiring and the column wiring, to which two pads for any one of straight lines A, B, C, and D are connected (pass through), are connected in the same cell. For example, the row wiring 11 and the column wiring 21 for straight line A, to which the row pad 41 and the column pad 43 are respectively connected, are connected in the same cell 1. For example, the row wiring 12 and the column wiring 21 for straight line B, to which the row pad 42 and the column pad 43 are respectively connected, are connected in the same cell 3. Such arrangement of three pads defined by straight line A and straight line B, or three pads defined by straight line C and straight line D, will be referred to as triangle arrangement because a triangle is formed if the three pads constituting the triangle arrangement are connected to one another. This triangle is typically, but not limited to, a right triangle or may be an equilateral triangle or an isosceles triangle. Note that the row pad 41, the column pad 43, and the column pad 44 also have a triangle arrangement, and the row pad 42, the column pad 43, and the column pad 44 also have a triangle arrangement. By employing a triangle arrangement, a plurality of overlapping pads can be arranged in a favorable manner.

For example, a case where the row pad 42 is arranged over the cell 3 unlike in FIG. 1B will be discussed. In this case, if the column pad 43 is arranged over the cell 3, the interval between the column pad 43 and the row pad 42 may be extremely short. Alternatively, if the column pad 43 is not arranged over the cell 3, a non-overlapping pad in place of the column pad 43 needs to be arranged at a position not overlapping with the cell array 1234. Although the column pad 43 may be arranged over the cell 4, this case increases a wiring path between the column pad 43 and the column wiring 21, increasing wiring resistance or wiring capacitance and causing RC delay. In contrast, by shifting the row pad 42 relative to the row pad 41 in the X-direction, that is, by changing the position of the row pad 42, to be instead of over the cell 3, to be over the cell 4 that is right to the cell 3, the column pad 43 can be arranged over the cell 3. Note that since the row pad 42 is connected to the row wiring 12, even if the row pad 42 is shifted in the X-direction, the wiring path between the row pad 42 and the row wiring 12 is not increased. By employing triangle arrangement in this manner, the row pads 41 and 42 and column pads 43 and 44 overlapping with the cell array 1234 can be arranged appropriately. That is, wiring paths between the row pads 41 and 42 and column pads 43 and 44 and the row wirings 11 and 12 and the column wirings 21 and 22, respectively, can be decreased, and also, intervals between the row pads 41 and 42 and column pads 43 and 44 can be increased.

The row pad 41, the row pad 42, the column pad 43, and the column pad 44 are arranged such that a straight line E connecting the row pad 41 and the row pad 42 passes between the column pad 43 and the column pad 44 in an X-Y plane perpendicular to the Z-direction. In a similar manner, the row pad 41, the row pad 42, the column pad 43, and the column pad 44 are arranged such that a straight line F connecting the column pad 43 and the column pad 44 passes between the row pad 41 and the row pad 42 in an X-Y plane perpendicular to the Z-direction. Such arrangement of the row pad 41, the row pad 42, the column pad 43, and the column pad 44 defined by straight line E and/or straight line F will be referred to as cross arrangement.

Such cross arrangement can increase the performance of the semiconductor apparatus. One of the advantages of cross arrangement is to be able to prevent the intervals between the row pads 41 and 42 and column pads 43 and 44 from being extremely small. If the intervals between the row pads 41 and 42 and column pads 43 and 44 can be prevented from being extremely small, the yield rate can be improved, and parasitic capacitance can be reduced. Another one of the advantages of cross arrangement is to be able to suppress increase in the wiring path lengths from the row pads 41 and 42 or column pads 43 and 44 to the row wirings 11 and 12 or the column wirings 21 and 22. Another advantage of the cross arrangement is to be able to prevent the wiring paths from the row pads 41 and 42 or column pads 43 and 44 to the row wirings 11 and 12 or the column wirings 21 and 22 from becoming complex. If the increase in the wiring path lengths can be suppressed or wiring paths can be prevented from becoming complex, the yield rate can be improved, and RC delay of wiring can be reduced.

For example, in FIG. 1B, if the column pad 44 arranged at a position overlapping with the cell 2 is moved to a position overlapping with the cell 3, straight line E does not pass between the column pad 43 and the column pad 44. That is, cross arrangement is no longer satisfied. In this case, since the column pad 43 and the column pad 44 overlap with the cell 3, the interval between the column pad 43 and the column pad 44 is decreased compared with the case in FIG. 1B. This may generate short circuit or crosstalk in the column pad 43 and the column pad 44. In addition, the column pad 44 that is moved to a position overlapping with the cell 3 has a greater distance from the column wiring 22 than in the case in FIG. 1B. This increases the wiring path length from the column pad 44 to the column wiring 22 or makes the wiring paths complex.

Although the cell array 1234 with two rows and two columns has been described with reference to FIG. 1B, the number of cells included in the cell array 1234 can be any number. A cell array 1234 with three rows and three columns will be described with reference to FIGS. 2A and 2B. A row wiring 11, a row wiring 12, and a row wiring 13 corresponding to the cell rows and a column wiring 21, a column wiring 22, and a column wiring 23 corresponding to the cell columns are provided. The connection of the row wirings 11 and 12 and the column wirings 21 and 22 to the cells and pads may be substantially the same as the connection illustrated in FIG. 1B, and thus, detailed description thereof is omitted. Cells 5, 6, and 05 are arranged in the X-direction, and the row wiring 13 is connected to the cells 5, 6, and 05. Cells 01, 02, and 03 are arranged in the Y-direction, and the column wiring 23 is connected to the cells 01, 02, and 03. The cell 01 and the cell 1 are arranged side by side in the X-direction, and the cell 02 and the cell 2 are arranged side by side in the X-direction. A row pad 41 is connected to the row wiring 11, a row pad 42 is connected to the row wiring 12, and a row pad 45 is connected to the row wiring 13. A column pad 43 is connected to the column wiring 21, a column pad 44 is connected to the column wiring 22, and a column pad 47 is connected to the column wiring 23. In addition, the row pads 41, 42, and 45 and the column pads 43, 44, and 47 are arranged to overlap with different cells.

Figure 2A:
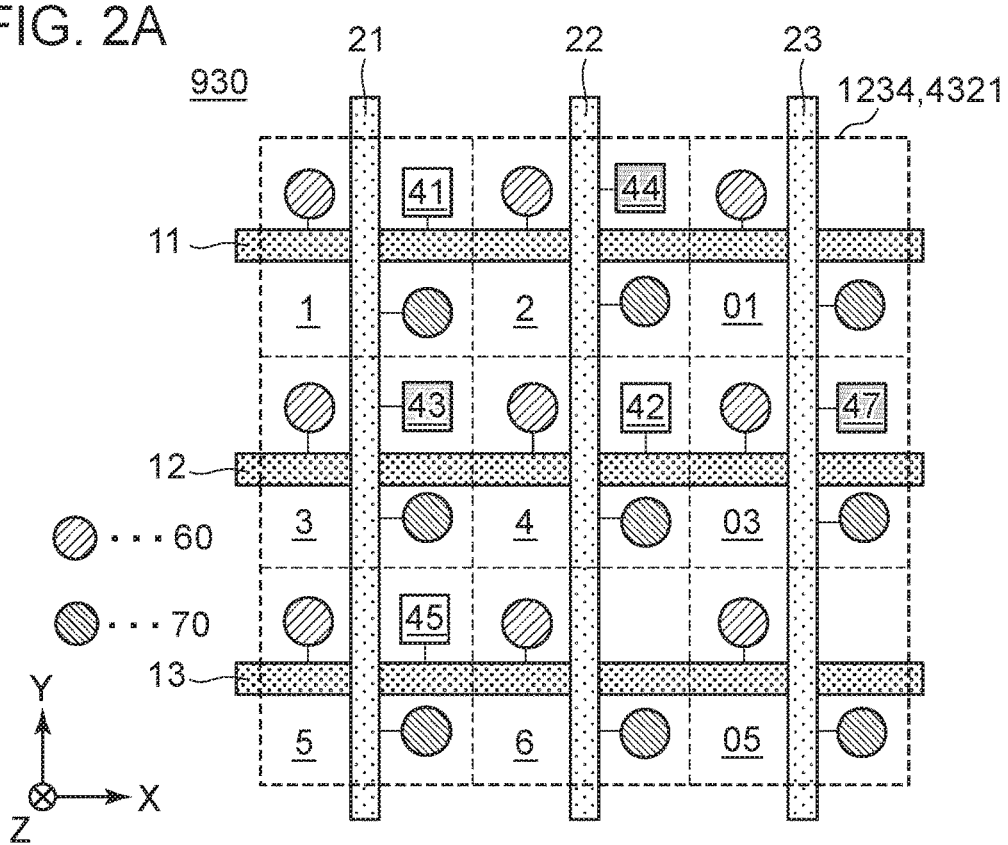
FIG. 2A schematically illustrates a semiconductor apparatus.

In FIG. 2A, straight line E passes between the column pad 43 and the column pad 44, and straight line E passes between the column pad 43 and the column pad 47. In addition, straight line G connecting (passing through) the row pad 42 and the row pad 45 passes through the column pad 43 and the column pad 47. Straight line G connecting (passing through) the row pad 42 and the row pad 45 also passes through the column pad 44 and the column pad 47.

In FIG. 2A, the row pads 41, 42, and 45 are not linearly arranged. That is, the row pad 41 is away from straight line G connecting (passing through) the row pad 42 and the row pad 45, the row pad 42 is away from a straight line connecting (passing through) the row pad 41 and the row pad 45, and the row pad 45 is away from straight line E connecting (passing through) the row pad 41 and the row pad 42. Such arrangement of the row pads 41, 42, and 45 will be referred to as non-linear arrangement.

As illustrated in FIG. 2A, the row pads 41, 42, and 45 are arranged in the cells 1, 4, and 5, respectively, such that the row pads 41, 42, and 45 have non-linear arrangement. Thus, since it is not possible to arrange the column pad 43 connected to the column wiring 21 in a shortest wiring path in the cells 1 and 4 and the column pad 43 is arranged in the cell 3, the arrangement of the column pad 43 has a degree of freedom of 1. Since the column pad 44 connected to the column wiring 22 is arranged in the cell 2 in FIG. 2A, but can also be arranged in the cell 6, the arrangement of the column pad 44 has a degree of freedom of 2. Since the column pad 47 connected to the column wiring 23 is arranged in the cell 03 in FIG. 2A, but can also be arranged in the cell 01 or the cell 05, the arrangement of the column pad 47 has a degree of freedom of 3. Accordingly, the degree of freedom of the column pads 43, 44, and 47 is 1×2×3=6.

Figure 2B:
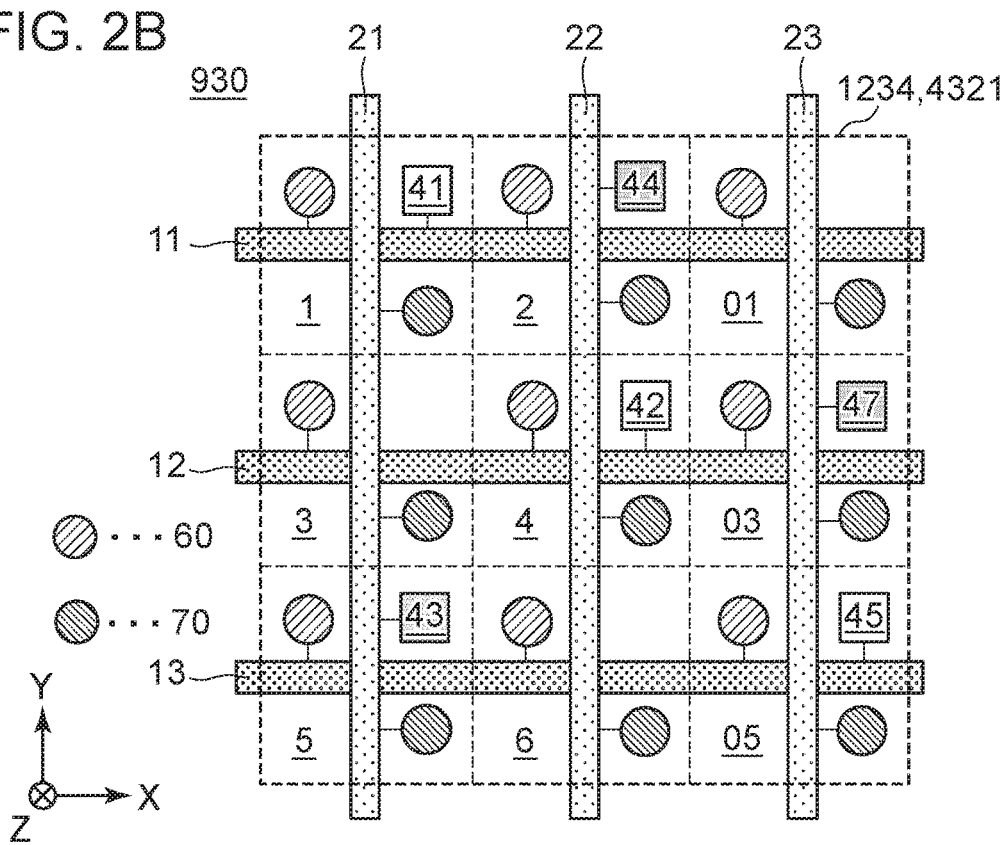
FIG. 2B schematically illustrates a semiconductor apparatus.

In FIG. 2B, the row pads 41, 42, and 45 are linearly arranged. The row pad 42 is located between the row pad 41 and the row pad 45, and a straight line connecting (passing through) the row pad 41 and the row pad 45 also passes through the row pad 42. Such arrangement of the row pads 41, 42, and 45 will be referred to as linear arrangement. By employing linear arrangement for the arrangement of the row pads 41, 42, and 45, the degree of freedom of the arrangement of the column pads 43, 44, and 47 is increased.

As illustrated in FIG. 2B, the row pads 41, 42, and 45 are arranged in the cells 1, 4, and 05, respectively, such that the row pads 41, 42, and 45 have a linear arrangement. Thus, since the column pad 43 connected to the column wiring 21 is arranged in the cell 5 in FIG. 2B, but can also be arranged in the cell 3, the arrangement of the column pad 43 has two degrees of freedom. Since the column pad 44 connected to the column wiring 22 is arranged in the cell 2 in FIG. 2B, but can also be arranged in the cell 6, the arrangement of the column pad 44 has two degrees of freedom. Since the column pad 47 connected to the column wiring 23 is arranged in the cell 03 in FIG. 2B, but can also be arranged in the cell 01, the arrangement of the column pad 47 has two degrees of freedom. Accordingly, the number of degrees of freedom of the column pads 43, 44, and 47 is 2×2×2=8, which is higher than in a case where non-linear arrangement is employed.

A cell array 1234 with four rows and four columns will be described with reference to FIGS. 3A and 3B. A row wiring 11, a row wiring 12, a row wiring 13, and a row wiring 14 corresponding to the cell rows are provided. Cells 7, 8, 07, and 08 are arranged in the X-direction, and the row wiring 14 is connected to the cells 7, 8, 07, and 08. Cells 02, 04, 06, and 08 are arranged in the Y-direction, and a column wiring 24 is connected to the cells 02, 04, 06, and 08. A row pad 46 is connected to the row wiring 14, a column pad 48 is connected to the column wiring 24. In addition, the row pads 41, 42, 45, and 46 and the column pads 43, 44, 47, and 48 are arranged to overlap with different cells.

Figure 3A:
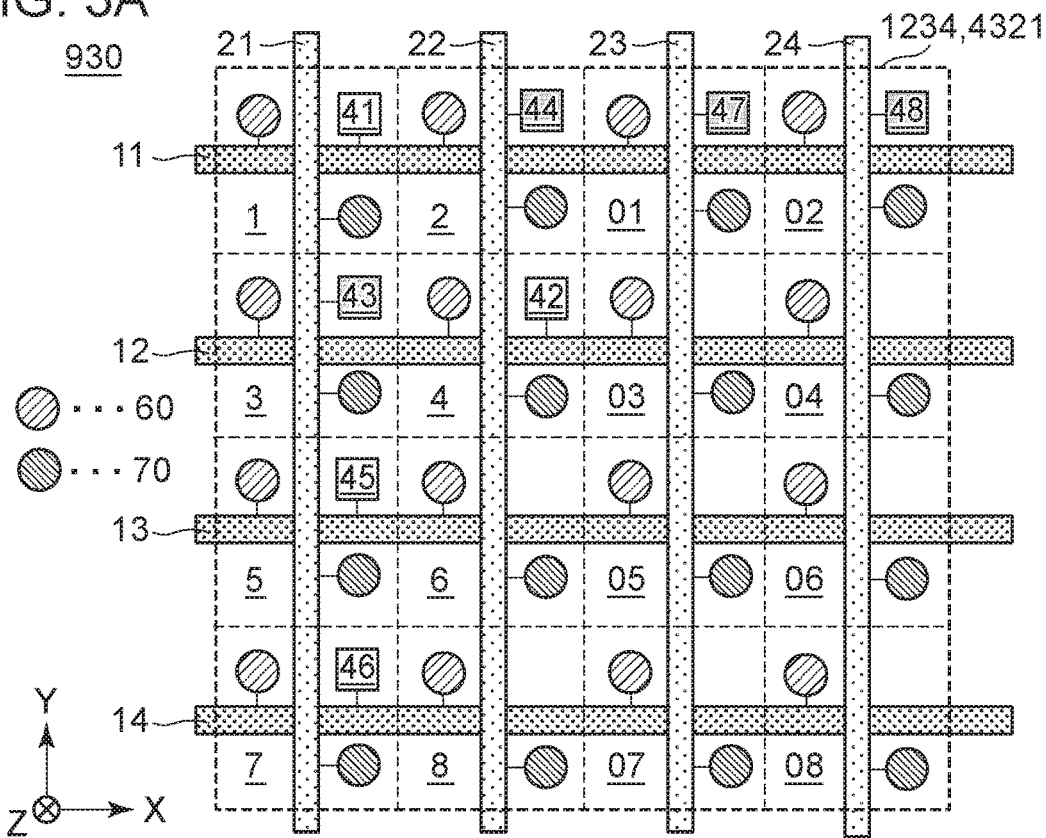
FIG. 3A schematically illustrates a semiconductor apparatus.

In the arrangement illustrated in FIG. 3A, the row pads 41 and 42 and the column pads 43 and 44 are in a cross arrangement. The row pads 41, 45, and 46 have a linear arrangement, and the row pad 42 is arranged away from (shifted from) a straight line connecting (passing through) any two of the row pads 41, 45, and 46. The column pads 44, 47, and 48 have a linear arrangement, and the column pad 43 is arranged away from (shifted from) a straight line connecting (passing through) any two of the column pads 44, 47, and 48.

Figure 3B:
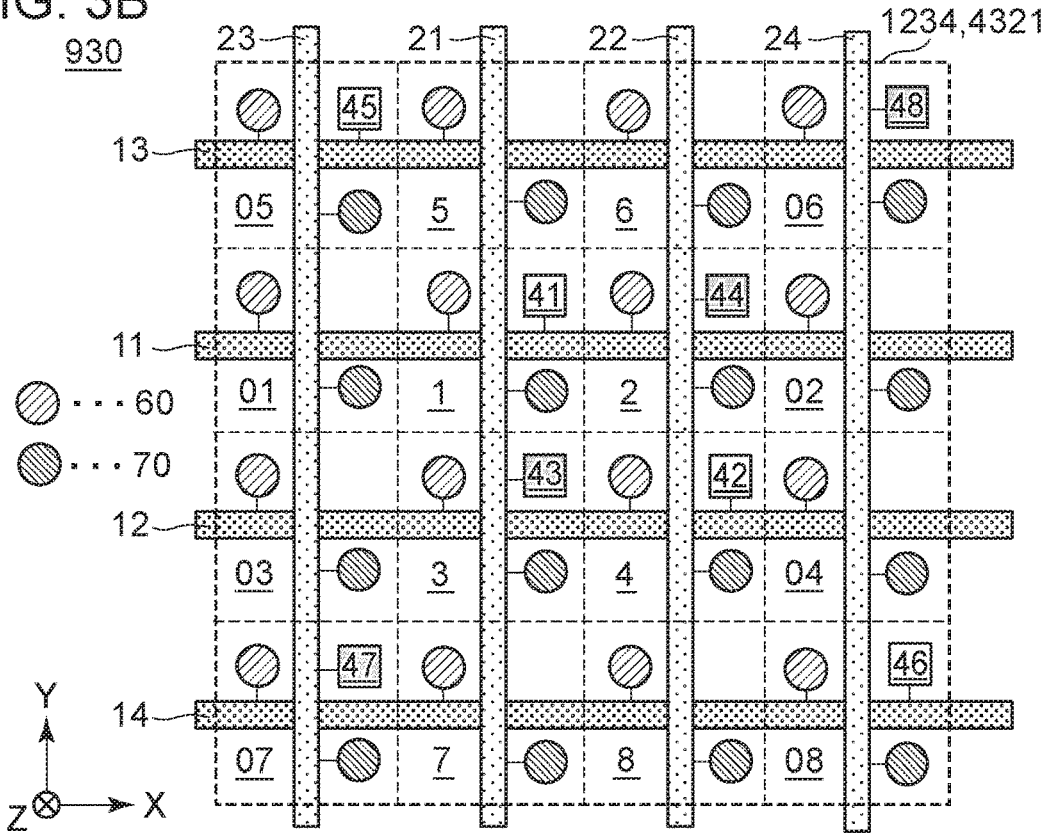
FIG. 3B schematically illustrates a semiconductor apparatus.

Also in the arrangement illustrated in FIG. 3B, the row pads 41 and 42 and the column pads 43 and 44 have cross arrangement. Also, the row pads 45 and 46 and the column pads 47 and 48 have cross arrangement. The row pads 41, 42, 45, and 46 have linear arrangement, and the column pads 43, 44, 47 and 48 have linear arrangement.

In the arrangement in FIGS. 1B, 2B, and 3B, distances from two or more cells on the same cell column (e.g., the cells 1, 3, 5, and 7) to row pads connected to the cells (e.g., the row pads 41, 42, 45, and 46) differ for each row pad. Thus, wiring path lengths from the cell column to the row pads may differ for each cell row. As a result, delay amounts of signals input to the cells through row wirings may differ for each cell row. If a large number of row pads are linearly arranged, variations in the wiring path lengths from a cell column to row pads increase. For example, in the arrangement in FIG. 2B, the distance from the cell 5 to the row pad 45 is substantially twice as long as the distance from the cell 3 to the row pad 42, the cell 3 belonging to the same cell column as the cell 5. For example, in the arrangement in FIG. 3B, the distance from the cell 07 to the row pad 46 is substantially three times as long as the distance from the cell 01 to the row pad 41, the cell 01 belonging to the same cell column as the cell 07. In contrast, as in the arrangement in FIGS. 2A and 3A, by employing non-linear arrangement for the row pads 41, 42, 45, and 46, variations in the wiring path lengths from a cell column to row pads can be reduced. In FIGS. 2A and 3A, distances from two or more cells on the same cell column (e.g., the cells 1, 5, and 7) to several row pads connected to the cells (e.g., the row pads 41, 45, and 46) are equal.

Figure 4A:
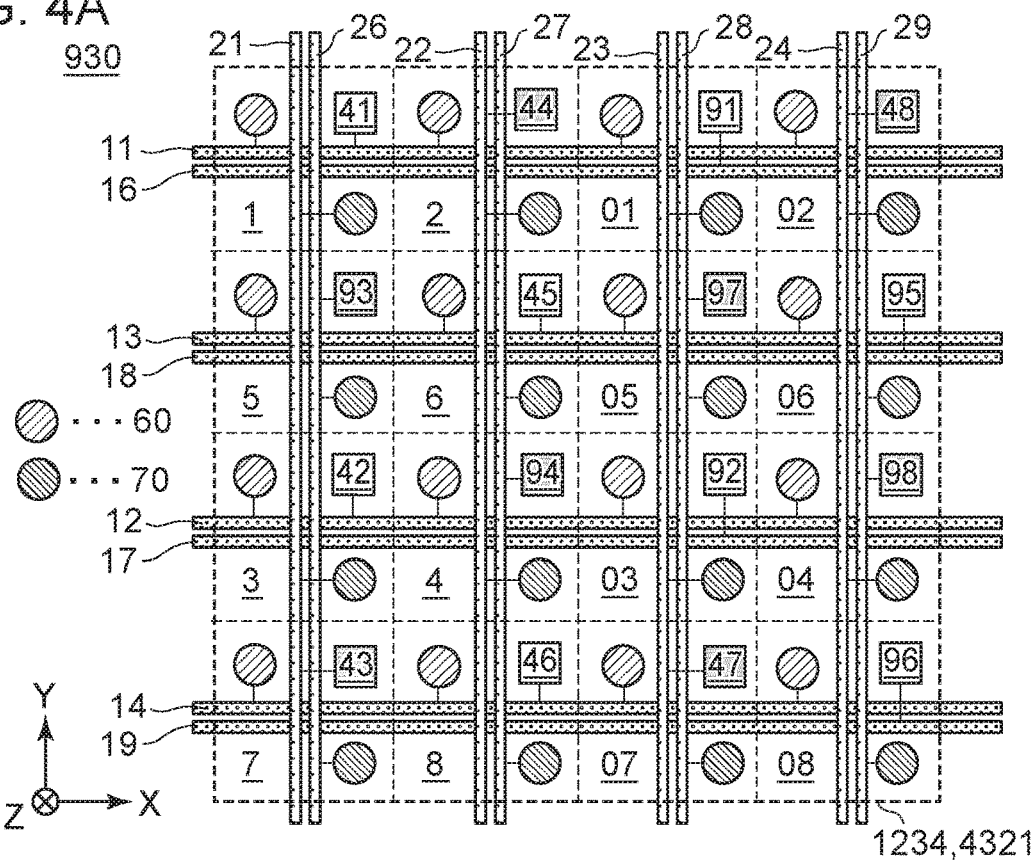
FIG. 4A schematically illustrates a semiconductor apparatus.
Figure 4B:
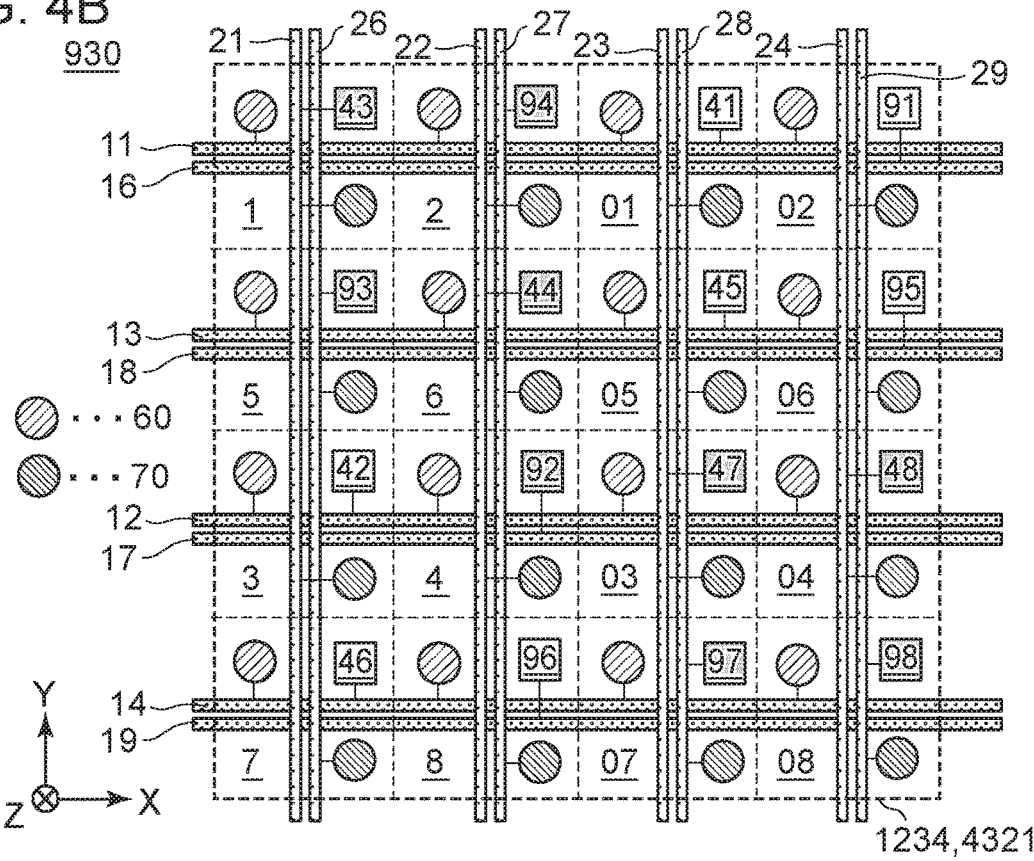
FIG. 4B schematically illustrates a semiconductor apparatus.

The arrangement illustrated in FIGS. 4A and 4B is different from the arrangement illustrated in FIGS. 3A and 3B in that a plurality of row wirings is provided on each cell row and/or that a plurality of column wirings is provided on each cell column. Regarding the row wirings, cells 1, 2, 01, and 02 belonging to same cell row are connected to a row wiring 11 and also to a row wiring 16. More specifically, the row wiring 11 is connected to a semiconductor element 60 of a first type included in the cell land to a semiconductor element 60 of a first type included in the cell 2. In addition, the row wiring 16 is connected to a semiconductor element (not illustrated) of a second type included in the cell 1 and to a semiconductor element (not illustrated) of a second type included in the cell 2. The row wiring 11 is a signal line for transmitting a signal of a first type, and the row wiring 16 is a signal line for transmitting a signal of a second type. A plurality of overlapping pads includes a row pad 41 that is a connection pad connected to the row wiring 11 as a signal line and a row pad 91 that is a connection pad connected to the row wiring 16 as a signal line. The same applies to the other row wirings. Cells 3, 4, 03, and 04 belonging to same cell row are connected to a row wiring 12 and also to a row wiring 17. Cells 5, 6, 05, and 06 belonging to same cell row are connected to a row wiring 13 and also to a row wiring 18. Cells 7, 8, 07, and 08 belonging to same cell row are connected to a row wiring 14 and also to a row wiring 19. A row pad 92 is connected to the row wiring 17, a row pad 95 is connected to the row wiring 18, and a row pad 96 is connected to the row wiring 19.

Regarding the column wirings, although the cells 1, 5, 3, and 7 belong to same cell column, the cells 1 and 3 are connected to a column wiring 21, and the cells 5 and 7 are connected to a column wiring 26. Similarly, the cells 6 and 8 are connected to a column wiring 27, the cells 05 and 07 are connected to a column wiring 28, and the cells 06 and 08 are connected to a column wiring 29. A column pad 93 is connected to the column wiring 26 connected to cells 5 and 7, a column pad 94 is connected to the column wiring 27 connected to cells 6 and 8, a column pad 97 is connected to the column wiring 28 connected to cells 05 and 07, and a column pad 98 is connected to the column wiring 29 connected to cells 06 and 08.

In the arrangement in FIG. 4B, the row pad 41 is located between the column pads 43 and 94 and the row pad 91, the row pad 45 is located between the column pads 44 and 93 and the row pad 95, the row pad 92 is located between the column pads 47 and 48 and the row pad 42, and the row pad 96 is located between the column pads 97 and 98 and the row pad 46. In this manner, when the column pads are arranged on a side of either of two row pads connected to the same cell row, the arrangement of the column pads is imbalanced, increasing an influence of fixed pattern noise. In the arrangement in FIG. 4A, the column pad 44 is located between the row pad 41 and the row pad 91, the column pad 97 is located between the row pad 45 and the row pad 95, the column pad 94 is located between the row pad 42 and the row pad 92, and the column pad 47 is located between the row pad 46 and the row pad 96. In this manner, by arranging each of the column pads between two row pads connected to the same cell row, the arrangement of the column pads can be less imbalanced.

In the arrangement in FIGS. 4A and 4B, a straight line connecting the column pad 43 and the column pad 93 that are connected to different column wirings is defined as straight line O, a distance between straight line O and the row pad 41 is defined as distance P, a distance between straight line O and the row pad 42 is defined as distance Q, and a distance between the row pad 41 and the row pad 42 is defined as distance R. If the difference between distance P and distance Q is larger than distance R (R<|P−Q|), differences in wiring path lengths from the two cells 1 and 3 connected to the same column wiring 21 to the row pads 41 and 42 corresponding to the cells 1 and 3 are increased. In this case, delay amounts of signals transmitted through the row wirings of the cells 1 and 3 differ, increasing variations in outputs of the cells 1 and 3. In contrast, in the arrangement in FIGS. 4A and 4B, the difference between distance P and distance Q is smaller than distance R (|P−Q|<R). This can reduce the differences in wiring path lengths from the two cells 1 and 3 connected to the same column wiring 21 to the row pads 41 and 42 corresponding to the cells 1 and 3. Thus, the difference in delay amounts of signals transmitted through the row wirings of the cells 1 and 3 can be reduced, and variations in outputs of the cells 1 and 3 can be reduced. Although the difference between distance P and distance Q is approximately $1/\sqrt{2}$ of distance R in the arrangement in FIG. 4B, the difference between distance P and distance Q may be less than or equal to ½ of distance R (|P−Q|≤R/2). In the arrangement in FIG. 4A, distance P is equal to distance Q, and the difference therebetween is zero. In addition, distance P and distance Q may be smaller than distance R (P<R, Q<R). In the arrangement in FIG. 4B, although distance Q is smaller than distance R, distance P is larger than distance R, and thus, variations are likely to occur in outputs of the cells 1 and 3. In contrast, in the arrangement in FIG. 4B, since distance Q and distance P are smaller than distance R, variations in outputs of the cells 1 and 3 can be reduced.

Furthermore, a distance between straight line O and the row pad 45 is defined as distance S, a distance between straight line O and the row pad 46 is defined as distance T, and a distance between the row pad 45 and the row pad 46 is defined as distance U. As with distance P, distance Q, and distance R, the difference between distance S and distance T may be smaller than distance U (|S−T|<U), the difference between distance S and distance T may be less than or equal to ½ of distance U (|S−T|≤U/2), and distance S and distance T may be smaller than distance U (S<U, T<U). This can reduce the possibility of variations in outputs of the cell 05 to which the row pad 45 is connected and the cell 7 to which the row pad 46 is connected.

Furthermore, the difference between distance S and distance T may be smaller than distance R (|S−T|<R), the difference between distance S and distance T may be less than or equal to ½ of distance R(|S−T|≤R/2), and distance S and distance T may be smaller than distance R (S<R, T<R). In addition, the difference between distance P and distance Q may be smaller than distance U (|P−Q|<U), the difference between distance P and distance Q may be less than or equal to ½ of distance U(|P−Q|≤U/2), and distance P and distance Q may be smaller than distance U (P<U, Q<U). This can reduce the possibility of variations in outputs of the column pad 43 through the column wiring 21 and the column pad 93 through the column wiring 26. For example, in the arrangement in FIG. 4A, distance S and distance T are approximately ½ of distance R, and distance P and distance Q are less than or equal to ¼ of distance U.

Although straight line O herein is defined by using the column pads 43 and 93, straight line O may be any straight line connecting two column pads corresponding to two column wirings each connecting two or more cells belonging to the same cell column. In other words, each of the two column pads used for defining a straight line corresponding to straight line O is at least connected to cells belonging to the same cell column. Thus, the row pads 41 and 42 and/or the row pads 45 and 46 can be arranged with respect to the straight line connecting the column pad 44 and the column pad 94 to satisfy the above-described relationship between distances P, Q, R, S, T, and U. The same applies to the straight line connecting the column pad 47 and the column pad 97 and the straight line connecting the column pad 48 and the column pad 98.

The row pads 41, 42, 45, and 46 connected to the row wirings 11, 12, 13, and 14 have been described herein. Similarly, the row pads 91, 92, 95, and 96 connected to the row wirings 16, 17, 18, and 19 can be arranged to satisfy the above-described relationship between distances P, Q, R, S, T, and U such that differences in distances from the straight line corresponding to straight line O are not increased.

The type of cells constituting the cell array 1234 is set as appropriate in accordance with usage of the semiconductor apparatus 930. For example, the cells may be pixel cells. The cell array 1234 constituted by pixel cells can capture or display images. A pixel cell for capturing an image may include a photoelectric conversion element.

A photoelectric conversion element may be a photodiode, a photogate, a component in which a photoelectric conversion film is sandwiched between a pair of electrodes, or the like. A pixel cell that displays an image may include an optical element. An optical element may be an electroluminescence (EL) element, a cathode luminescence (CL) element, a liquid crystal element, a mirror element, or the like. For example, a cell may be a memory cell. A cell array 1234 constituted by memory cells operate as a memory. A memory cell may be static random access memory (SRAM) cell, a dynamic random access memory (DRAM) cell, or a flash memory cell.

One of the row wiring and the column wiring may be a signal line (drive signal line) for transmitting a drive signal for driving a cell. The drive signal line is typically connected to a gate of a transistor included in the cell and controls operation timing of the cell. If the cell is a memory cell, the drive signal line is a word line. The other of the row wiring and the column wiring may be a signal line (information signal line) for transmitting an information signal including information treated in a cell. The information signal line is typically connected to a source or a drain of a transistor included in the cell. If the cell is a pixel cell, the information signal is a pixel signal, and the pixel signal may represent a signal level in accordance with charge generated by the photoelectric conversion element or a signal level in accordance with a luminance level of a display element. If the cell is a memory cell, the information signal line is a bit line for reading data recorded on the memory cell or writing data on the memory cell.

In addition, the row wiring and/or the column wiring is not limited to a wiring for transmitting a signal for which a signal level is temporally changed, but may be a wiring (potential supply line) for supplying a fixed potential to be used as a power supply potential, a ground potential, or a reference potential.

A circuit in the semiconductor component 201, which is connected to the information signal line of the semiconductor component 101, may be an information processing circuit. A circuit in the semiconductor component 201, which connected to the drive signal line of the semiconductor component 101, may be a drive circuit for generating a drive signal.

EXAMPLES

Figure 5A:
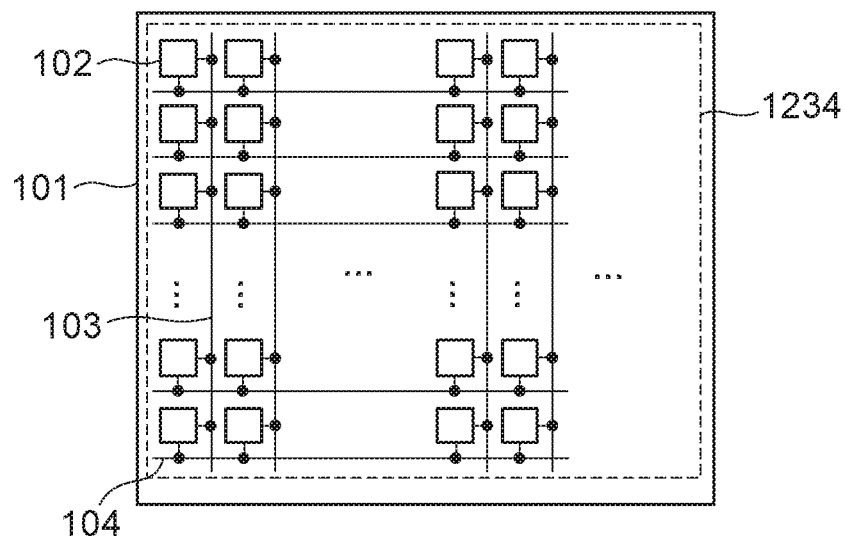
FIG. 5A schematically illustrates a semiconductor apparatus according to examples.

Now, a configuration common to the following first to fifth examples will be described. FIG. 5A schematically illustrates a semiconductor apparatus according to the examples. In a cell array 1234 of a semiconductor component 101, cells 102 are arranged in matrix. A plurality of cells on the same cell column is connected via a column wiring 103, and signals from the cells 102 are output through the column wiring 103. A plurality of cells on the same cell row is connected via a row wiring 104, and signals are input to the cells 102 through the row wiring 104. Each of a plurality of row wirings 104 is connected to two or more cells on the same cell row of the cell array 1234 and is provided for a corresponding cell row of the cell array 1234. Each of a plurality of column wirings 103 is connected to two or more cells on the same cell column of the cell array 1234 and is provided for a corresponding cell column of the cell array 1234.

Figure 5B:
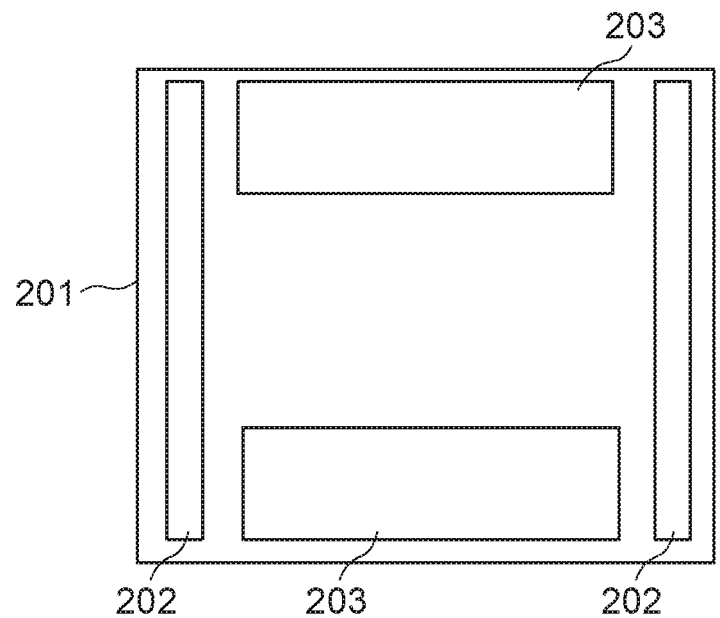
FIG. 5B schematically illustrates the semiconductor apparatus according to examples.

In a semiconductor component 201 in FIG. 5B, at least a control circuit 202 and a processing circuit 203 are arranged. The control circuit 202 outputs drive signals for driving the cells 102, and the processing circuit 203 processes signals output from the cells 102. By stacking the semiconductor component 101 and the semiconductor component 201, a stacked-type semiconductor apparatus is formed. Furthermore, the control circuit 202 is connected to corresponding row wirings 104, and the processing circuit 203 that processes signals output from the cells 102 is connected to corresponding column wirings 103.

Figure 5C:
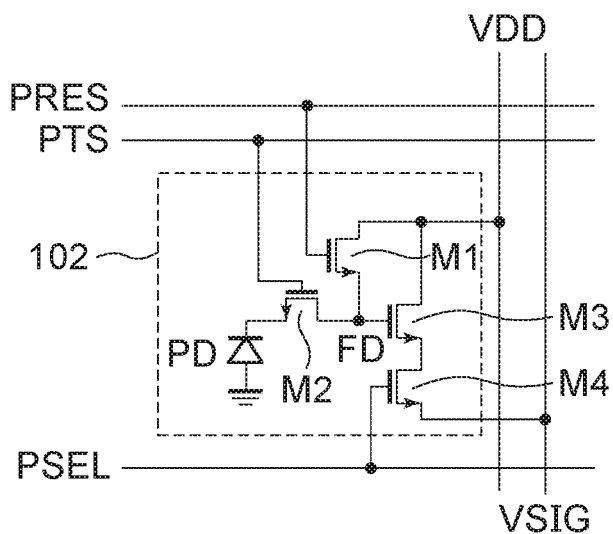
FIG. 5C schematically illustrates the semiconductor apparatus according to examples.

FIG. 5C illustrates a configuration example of a cell 102. The cell 102 includes a photodiode PD, which is a photoelectric conversion element, a transfer transistor M2 that transfers charge of the photodiode PD to a detection node PD formed of a floating diffusion, and a reset transistor M1 that resets the detection node PD. The detection node FD is connected to a gate of an amplifier transistor M3, and a power supply voltage is supplied to the amplifier transistor M3 and the reset transistor M1. A selection transistor M4 is connected to a source of the amplifier transistor M3, and the selection transistor M4 is connected to a column wiring 103. Drive signals, which are a reset signal PRES, a transfer signal PTS, and a selection signal PSEL, are input to gates of the reset transistor M1, the transfer transistor M2, and the selection transistor M4, respectively, from a control circuit 202 through a plurality of signal lines included in a row wiring 104. A power supply potential VDD is supplied to the reset transistor M1 and the amplifier transistor M3 from a power supply potential supply line as a row wiring. Although an example in which a pixel cell includes four transistors has been described herein, the selection transistor M4 may be omitted and three transistors may be used, or, in addition to the four transistors, transistors that implement various additional functions may be added.

First Example

Figure 6A:
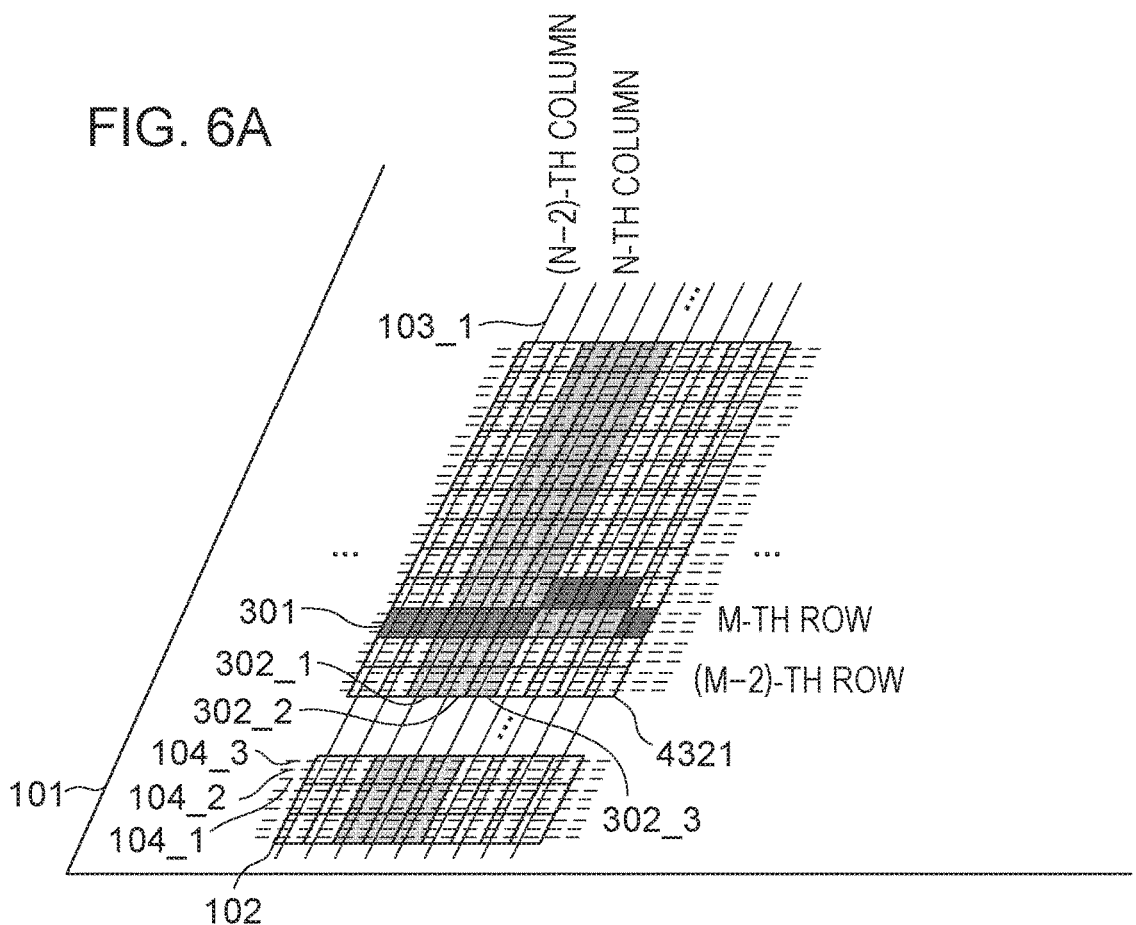
FIG. 6A schematically illustrates a semiconductor apparatus according to a first example.
Figure 6B:
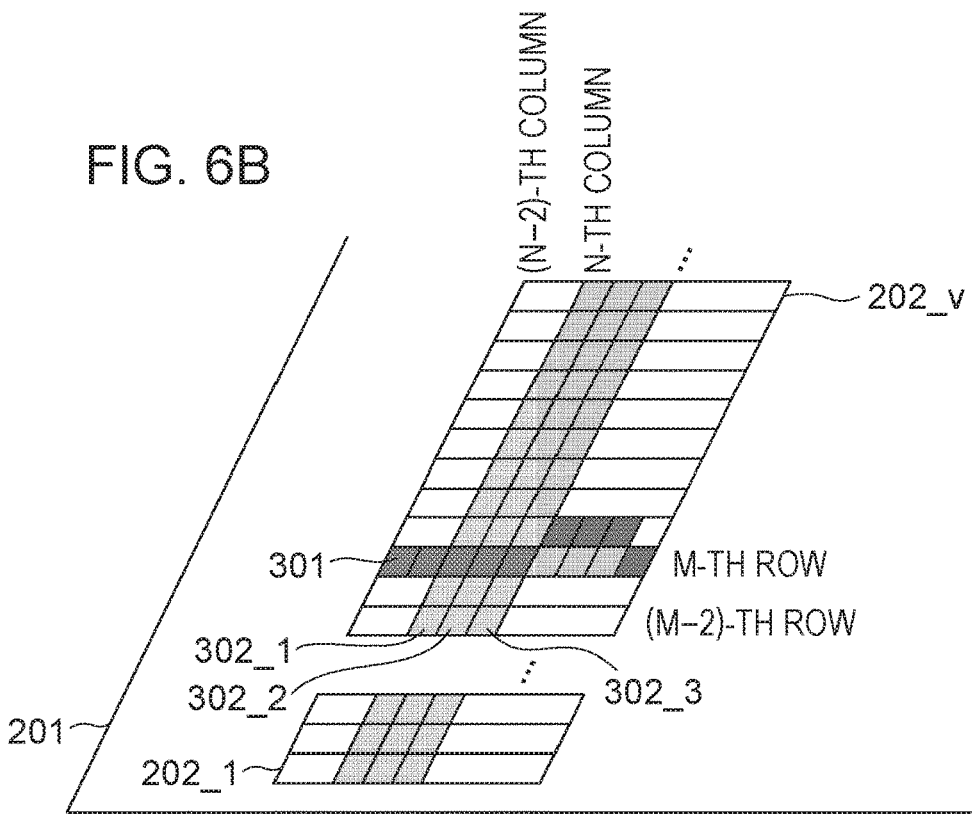
FIG. 6B schematically illustrates the semiconductor apparatus according to the first example.

FIGS. 6A and 6B illustrate the relationship between row wirings 104_1 to 104_3 corresponding to a control circuit 202_1 and row pads 302_1 to 302_3 connected to the row wirings 104_1 to 104_3. FIGS. 6A and 6B further illustrate the relationship between column wirings 103_1 corresponding to a processing circuit 203 and column pads 301 connected to the column wirings 103_1. In a pad array 4321, the column pads 301 and/or the row pads 302 are arranged in matrix. The pad array 4321 includes a plurality of pads arranged in matrix to overlap with the cell array 1234. A column in which the column pads 301 and/or the row pads 302 are arranged is referred to as a pad column, and a row in which the column pads 301 and/or the row pads 302 are arranged is referred to as a pad row. FIGS. 6A, 6B, and 6C illustrate a plurality of pad rows including an (M+1)-th row and a plurality of pad columns including an N-th column. In a semiconductor component 101, a single column wiring 103_1 is arranged in each cell column. The matrix wiring includes a plurality of row wirings 104 each connected to two or more cells in the same cell row. Three row wirings 104_1, 104_2, and 104_3 are arranged in each cell row. The plurality of pads includes several row pads 302_1, 302_2, and 302_3 connected to the plurality of row wirings 104_1, 104_2, and 104_3, respectively. The row wiring 104_1 is for transmitting a reset signal PRES and is connected to a gate of a reset transistor M1 of a cell 102. The row wiring 104_2 is for transmitting a selection signal PSEL and is connected to a gate of a selection transistor M4 of the cell 102. The row wiring 104_3 is for transmitting a transfer signal PTS and is connected to a gate of a transfer transistor M2 of the cell 102.

In FIG. 6C, locations of row pads corresponding to each cell row are denoted by "r", "s", and "t". In FIG. 6C, "r" denotes, for example, the location of the row pad 302_1 connected to the row wiring 104_1, "s" denotes, for example, the location of the row pad 302_2 connected to the row wiring 104_2, and "t" denotes, for example, the location of the row pad 302_3 connected to the row wiring 104_3. In FIG. 6C, the location of a column pad corresponding to each cell column is denoted by "o".

In a semiconductor component 201, as the control circuit 202, a plurality of (v) control circuits 202_1 to 202_v corresponding to the respective rows is arranged at the same pitch as the pitch of the cell rows. The column pad 301 is a pad for the column wiring 103_1 connected to the processing circuit 203. The row pads 302_1 to 302_3 are pads for the row wirings 104_1 to 104_3 connected to the control circuit 202_1. The number of column pads 301 and row pads 302 may be one per cell. The pad array 4321 may include a dummy pad that is not the row pad 302 or the column pad 301. In FIG. 6B, a dummy pad may be provided in a pad row or a pad column that is not denoted by any of "r", "s", "t", and "o".

The arrangement of the column pads 301 will be described. The column pad 301 is arranged in each cell column and for each column wiring 103. In FIGS. 6A and 6B, the column pad 301 provided for each column wiring 103 is not denoted by reference numeral 301 except in a (N−2)-th column. Thus, FIG. 6C is to be referred to for detailed pad arrangement. In order to suppress image quality degradation, it is possible to maintain a correspondence relationship with a group (cell row, cell column) of the cells 102 arranged in the semiconductor component 101 and peripheral circuits. Thus, the column wiring 103 in each cell column is connected to the processing circuit 203 of the semiconductor component 201 in the corresponding cell column. Thus, the column pads 301 may be arranged over the control circuit 202. Furthermore, it is desirable that wiring path lengths from the processing circuit 203 of the semiconductor component 201 to the column pads 301 be equal.

The arrangement of the row pads 302_1 to 302_3 will be described. The row pads 302_1 to 302_3 are arranged in each cell row and for each row wiring 104. The row pads 302_1 to 302_3 in an M-th row are connected to a certain row wiring 104 among a plurality of row wirings 104, and the row pads 302_1 to 302_3 in the rows other than the M-th row are connected to the other row wirings 104 among the plurality of row wirings 104. In FIGS. 6A and 6B, the row pads 302_1 to 302_3 provided for each cell row are not denoted by reference numerals 302_1 to 302_3 except in a (M−2)-th row. Thus, FIG. 6C is to be referred to for detailed pad arrangement. If the column pads 301 are not arranged over the control circuit 202, the row pads 302_1 to 302_3 in each row may be arranged in all rows and in N-th to (N+2)-th columns of the pad array 4321. However, the column pads 301 are arranged over the control circuit 202 in this example. That is, the column pads 301 are arranged in the M-th row, N-th column to the M-th row, (N+2)-th column of the pad array 4321. Thus, since it is not possible to arrange the row pads 302_1 to 302_3 in the M-th row, N-th column to the M-th row, (N+2)-th column, the row pads 302_1 to 302_3 in the M-th row are arranged in (N+3)-th to (N+5)-th columns to avoid the N-th to (N+2)-th columns. That is, the row pads 302_1 to 302_3 are discontinuous between the (N+2)-th column and the (N+3)-th column, and pad rows in which the row pads 302_1 to 302_3 are arranged are shifted. In this manner, the row pads 302_1 to 302_3 in the M-th row and the row pads 302_1 to 302_3 in the rows other than the M-th row are arranged in different pad columns (the (N+3)-th to (N+5)-th columns and the N-th to (N+2)-th columns) of the pad array 4321.

With the above configuration, the column pads 301 and the row pads 302_1 to 302_3 can be arranged to overlap with the cell array 1234 in a plan view. In addition, the column wirings 103_1 of the semiconductor component 101 and the processing circuit 203 of the semiconductor component 201 can be connected in a favorable manner via the column pads 301. Furthermore, the row wirings 104_1 to 104_3 of the semiconductor component 101 and the control circuit 202 of the semiconductor component 201 can be connected via the row pads 302_1 to 302_3.

The column pads 301 are arranged in the (M+1)-th row, (N+3)-th column to the (M+1)-th row, (N+5)-th column of the pad array 4321. Since it is not possible to arrange the column pads 301 in the M-th row, (N+3)-th column to the M-th row, (N+5)-th column, the column pads 301 in the (N+3)-th to (N+5)-th columns are arranged in the (M+1)-th row, (N+3)-th column to the (M+1)-th row, (N+5)-th column to avoid the M-th row. In this manner, in the (N+3)-th to (N+5)-th pad columns of the pad array 4321 including the row pads 302_1 to 302_3 in the M-th row, the column pads 301 connected to cells to which the row pads 302_1 to 302_3 in the M-th row are connected are arranged (in the (M+1)-th row). In addition, in the N-th to (N+2)-th pad columns including the row pads 302_1 to 302_3 in the rows other than the M-th row, the column pads 301 connected to cells to which the row pads 302_1 to 302_3 in the rows other than the M-th row are connected are arranged.

The above example has illustrated a case where, as the control circuit 202, the control circuits 202_1 to 202_v corresponding to the respective rows are arranged at the same pitch as the pitch of the cell rows. However, the control circuits 202_1 to 202_v corresponding to the respective rows of the control circuit 202 may alternatively be arranged at a different pitch from the pitch of the cell rows in such a relationship that the number of column pads 301 and row pads 302_1 to 302_3 is less than or equal to one per cell pitch. In addition, although the above example has illustrated a case where the row wiring is three row wirings 104_1 to 104_3 and the column wiring is a single column wiring 103_1, the present invention is not limited to this relationship. The arrangement in this example is an example, and discontinuous locations of the column pads 301 and the row pads 302_1 to 302_3 are not limited to the locations illustrated in this example.

Second Example

Figure 7A:
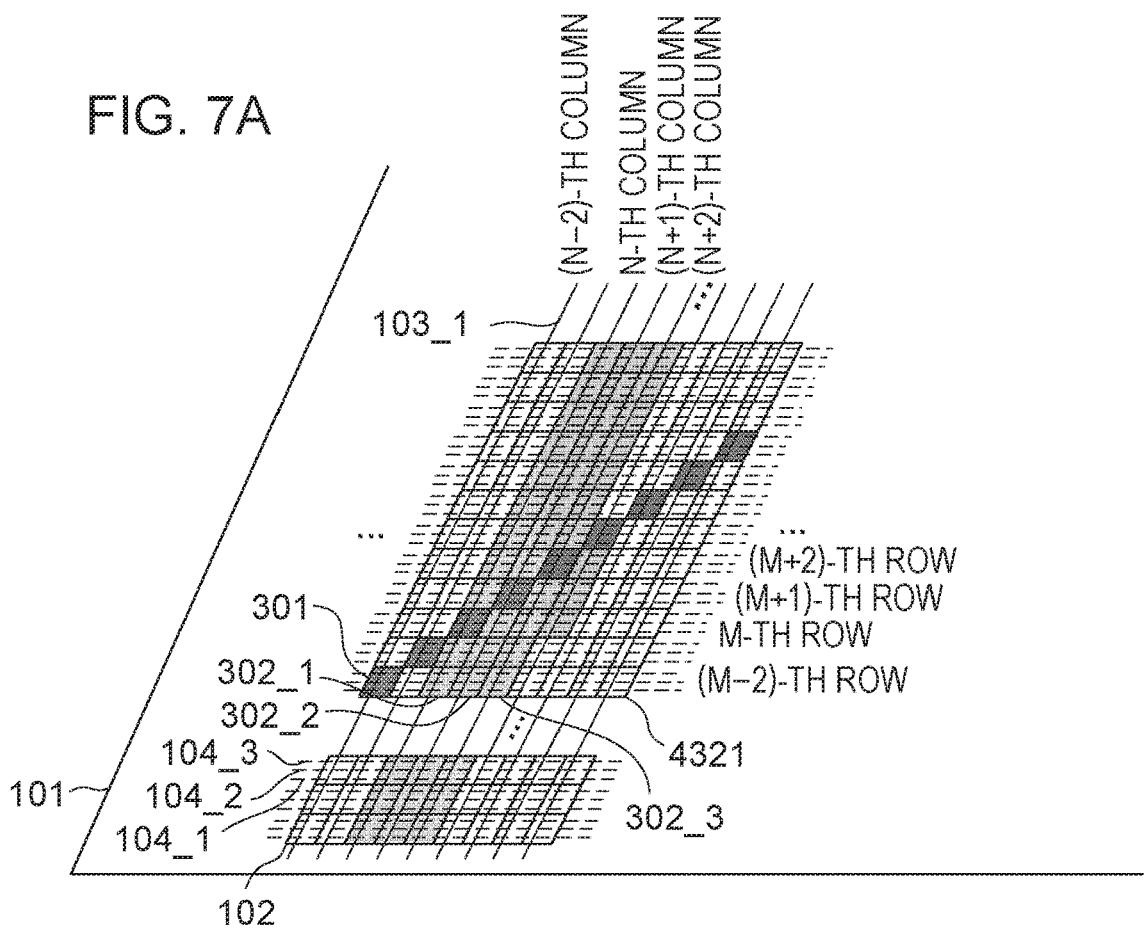
FIG. 7A schematically illustrates a semiconductor apparatus according to a second example.
Figure 7B:
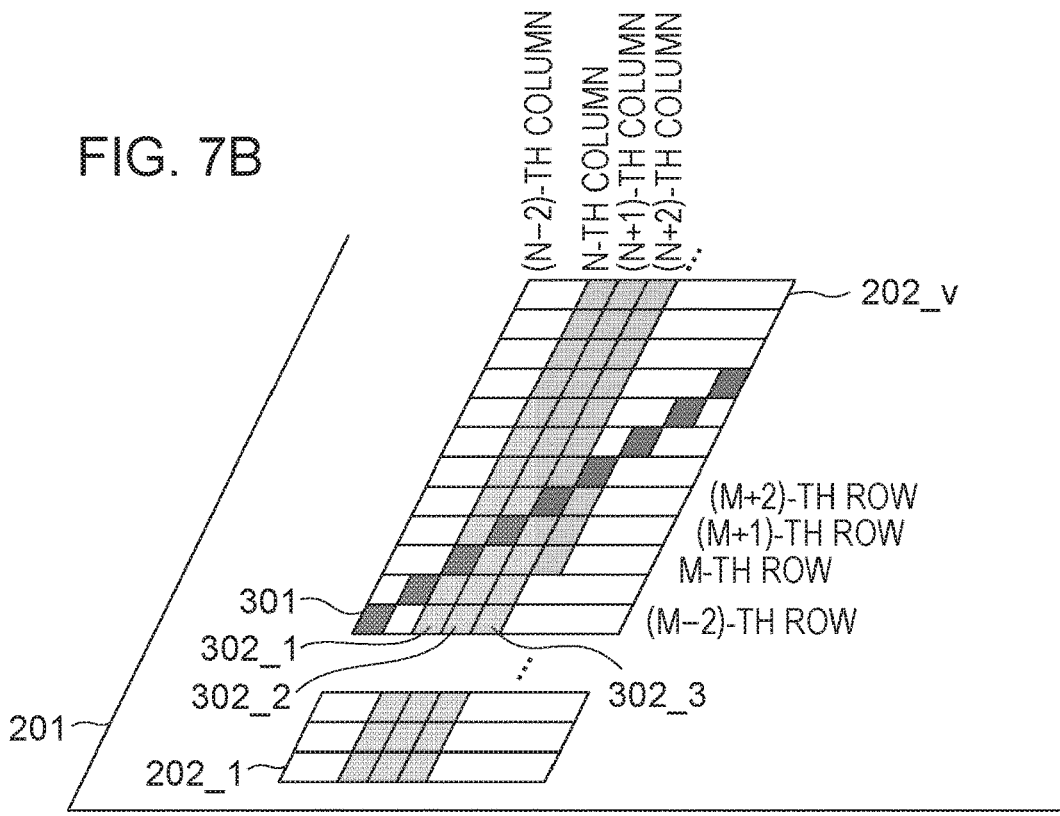
FIG. 7B schematically illustrates the semiconductor apparatus according to the second example.

The second example will be described with reference to FIGS. 7A to 7C. In FIGS. 7A to 7C, parts corresponding to FIGS. 6A to 6C are denoted by the same reference numerals and will be omitted from description. The relationship among FIGS. 7A, 7B, and 7C is substantially the same as the relationship among FIGS. 6A, 6B, and 6C.

In the second example, the column pads 301 are arranged to be shifted in each pad column by one row. Thus, wirings to the column pads 301 that connect the processing circuit 203 and the corresponding column wirings 103_1 are simple. In the first example, a plurality of wirings that connects the processing circuit 203 and the corresponding column wirings 103_1 needs to be provided in each of the control circuits 202_1 to 202_v corresponding to the respective rows arranged in the control circuit 202. Furthermore, the control circuits 202_1 to 202_v corresponding to the respective rows arranged in the control circuit 202 need to be provided in a plurality of rows.

The arrangement of the row pads 302_1 to 302_3 will be described. The row pads 302 in the rows other than the M-th to (M+2)-th rows are arranged in the N-th to (N+2)-th columns. In the second example, the column pads 301 are arranged in the M-th row, N-th column, the (M+1)-th row, (N+1)-th column, and the (M+2)-th row, (N+2)-th column of the pad array 4321. Thus, since it is not possible to arrange any of the row pads 302_1 to 302_3 in the M-th row, N-th column, the (M+1)-th row, (N+1)-th column, and the (M+2)- th row, (N+2)-th column, at least one of the row pads 302_1 to 302_3 in each row of the M-th to (M+2)-th rows needs to be shifted to a pad column other than the N-th to (N+2)-th columns. Thus, in the M-th to (M+2)-th rows, the row pads 302_3 are arranged in the (N+3)-th column.

The above example has illustrated a case where, as the control circuit 202, the control circuits 202_1 to 202_*v* corresponding to the respective rows are arranged at the same pitch as the pitch of the cell rows. However, the control circuits 202_1 to 202_*v* corresponding to the respective rows of the control circuit 202 may alternatively be arranged at a different pitch from the pitch of the cell rows in such a relationship that the number of column pads 301 and row pads 302_1 to 302_3 is less than or equal to one per cell pitch. In addition, although the above example has illustrated a case where the row wiring is three row wirings 104_1 to 104_3 and the column wiring is a single column wiring 103_1, the present invention is not limited to this relationship. The arrangement in this example is an example, and discontinuous locations of the column pads 301 and the row pads 302_1 to 302_3 are not limited to the locations illustrated in this example.

Third Example

Figure 8A:
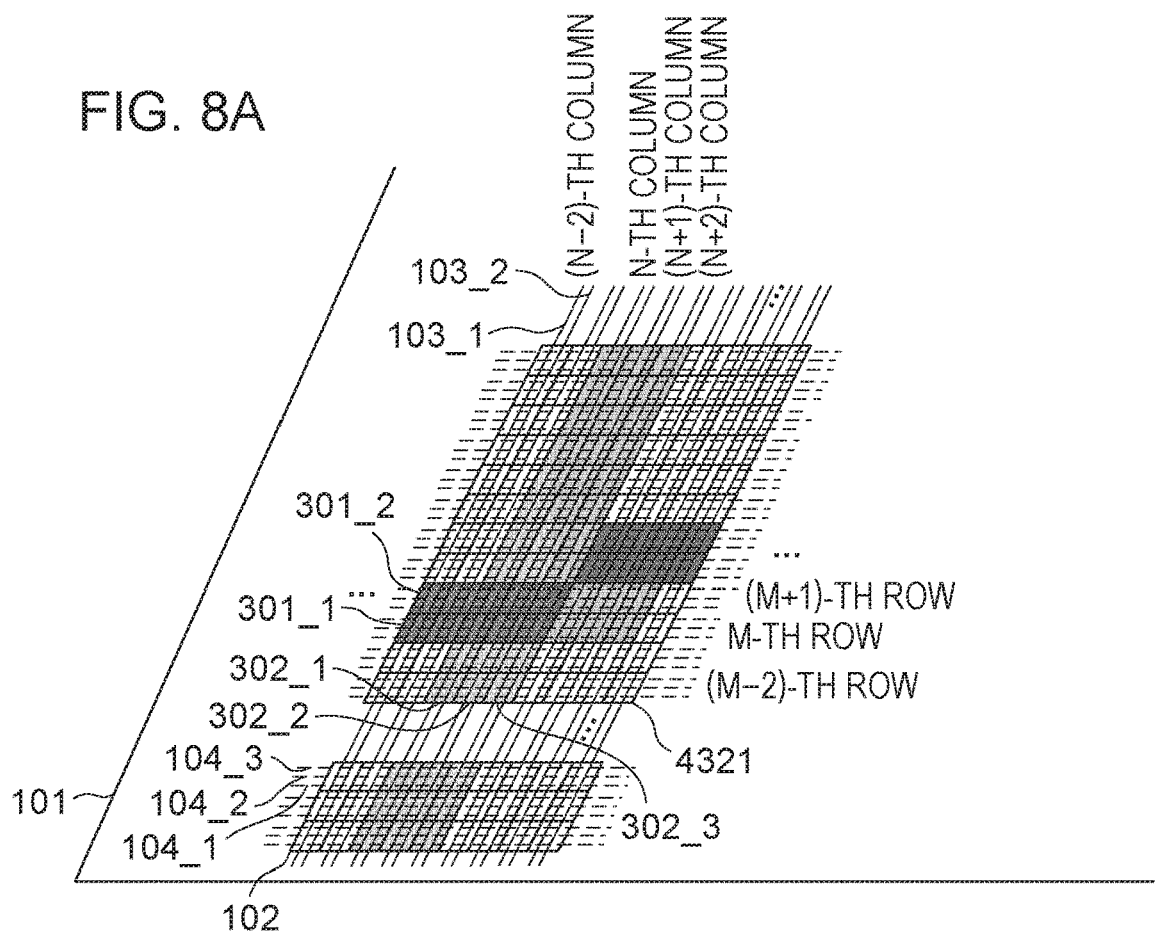
FIG. 8A schematically illustrates a semiconductor apparatus according to a third example.
Figure 8B:
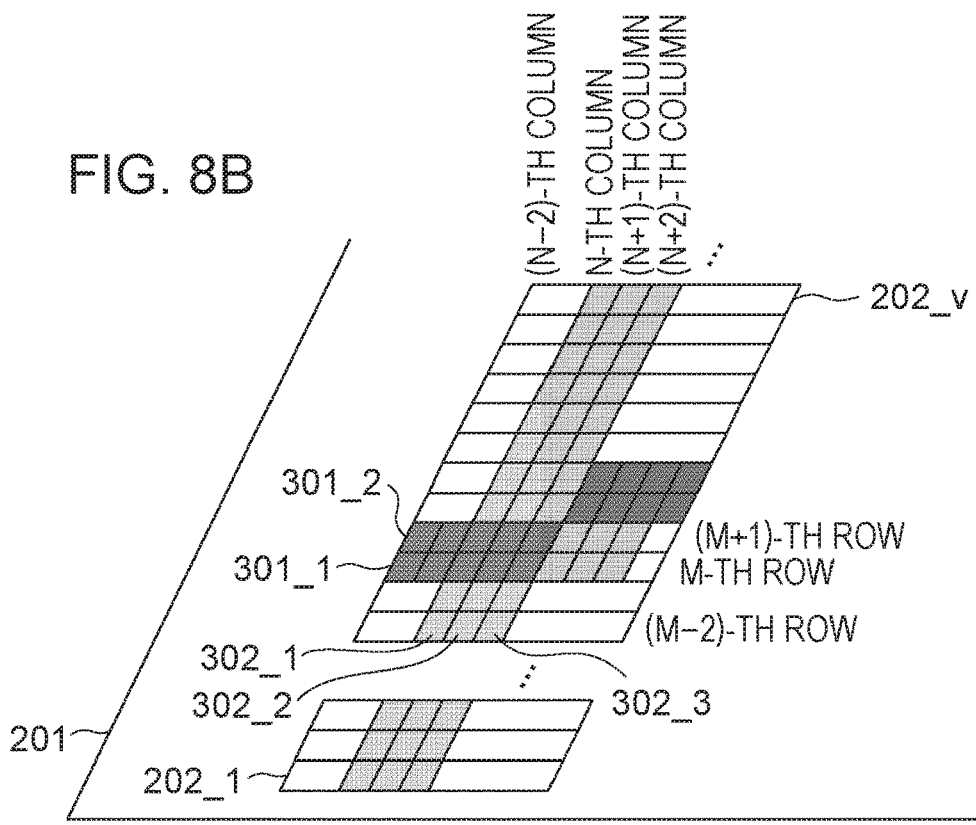
FIG. 8B schematically illustrates the semiconductor apparatus according to the third example.

The third example will be described with reference to FIGS. 8A to 8C. In FIGS. 8A to 8C, parts corresponding to FIGS. 6A to 6C are denoted by the same reference numerals and will be omitted from description. The relationship among FIGS. 8A, 8B, and 8C is substantially the same as the relationship among FIGS. 6A, 6B, and 6C.

In the third example, as the column wiring, two column wirings 103_1 and 103_2 are provided in the same cell column Thus, pads for the column wirings 103_1 and 103_2 corresponding to the processing circuit 203 are column pads 301_1 and 301_2. In FIG. 8C, locations of column pads corresponding to each cell column are denoted by "a" and "b". In FIG. 8C, "a" denotes, for example, the location of the column pad 301_1 connected to the column wiring 103_1, and "b" denotes, for example, the location of the column pad 301_2 connected to the column wiring 103_2.

The arrangement of the column pads 301_1 and 301_2 will be described. In order to suppress image quality degradation, it is possible to maintain a correspondence relationship with a group of the cells 102 arranged in the semiconductor component 101 and peripheral circuits. Thus, the column wirings 103_1 and 103_2 in each cell column are connected to the processing circuit 203 of the semiconductor component 201 in the corresponding cell column. Thus, the column pads 301_1 and 301_2 may be arranged over the control circuit 202.

The arrangement of the row pads 302_1 to 302_3 will be described. The row pads 302_1 to 302_3 are arranged in each cell row. If the column pads 301_1 and 301_2 are not arranged over the control circuit 202, the row pads 302_1 to 302_3 in each row may be arranged in all rows and in N-th to (N+2)-th columns. However, the column pads 301_1 and 301_2 are arranged over the control circuit 202 in this example. That is, the column pads 301_1 and 301_2 are arranged in the M-th row, N-th column to the M-th row, (N+2)-th column and in the (M+1)-th row, N-th column to the(M+1)-th row, (N+2)-th column. Thus, since it is not possible to arrange the row pads 302_1 to 302_3 in the M-th row, N-th column to the M-th row, (N+2)-th column and in the (M+1)-th row, N-th column to the(M+1)-th row, (N+2)-th column, the row pads 302_1 to 302_3 in the M-th row and the (M+1)-th row are arranged in the (N+3)-th to (N+5)-th columns to avoid the N-th to (N+2)-th columns. That is, the row pads 302_1 to 302_3 are arranged are shifted to the (N+3)-th to (N+5)-th columns in pad rows (two pad rows, the M-th row and the (M+1)-th row) the number of which is equal to the number (two) of the column wirings 103.

With the above configuration, the column pads 301_1 and 301_2 and the row pads 302_1 to 302_3 can be arranged to overlap with the cell array 1234. In addition, the column wirings 103_1 and 103_2 of the semiconductor component 101 and the processing circuit 203 of the semiconductor component 201 can be connected via the column pads 301_1 and 301_2. Furthermore, the row wirings 104_1 to 104_3 of the semiconductor component 101 and the control circuit 202 of the semiconductor component 201 can be connected via the row pads 302_1 to 302_3. The above example has illustrated a case where, as the control circuit 202, the control circuits 202_1 to 202_*v* corresponding to the respective rows are arranged at the same pitch as the pitch of the cell rows. However, the control circuits 202_1 to 202_*v* corresponding to the respective rows of the control circuit 202 may alternatively be arranged at a different pitch from the pitch of the cell rows in such a relationship that the number of column pads 301_1 and 301_2 and row pads 302_1 to 302_3 is less than or equal to one per cell pitch. In addition, although the above example has illustrated a case where the row wiring is three row wirings 104_1 to 104_3 and the column wiring is two column wirings 103_1 and 103_2, the present invention is not limited to this relationship. The arrangement in this example is an example, and discontinuous locations of the column pads 301_1 and 301_2 and the row pads 302_1 to 302_3 are not limited to the locations illustrated in this example.

Fourth Example

Figure 9A:
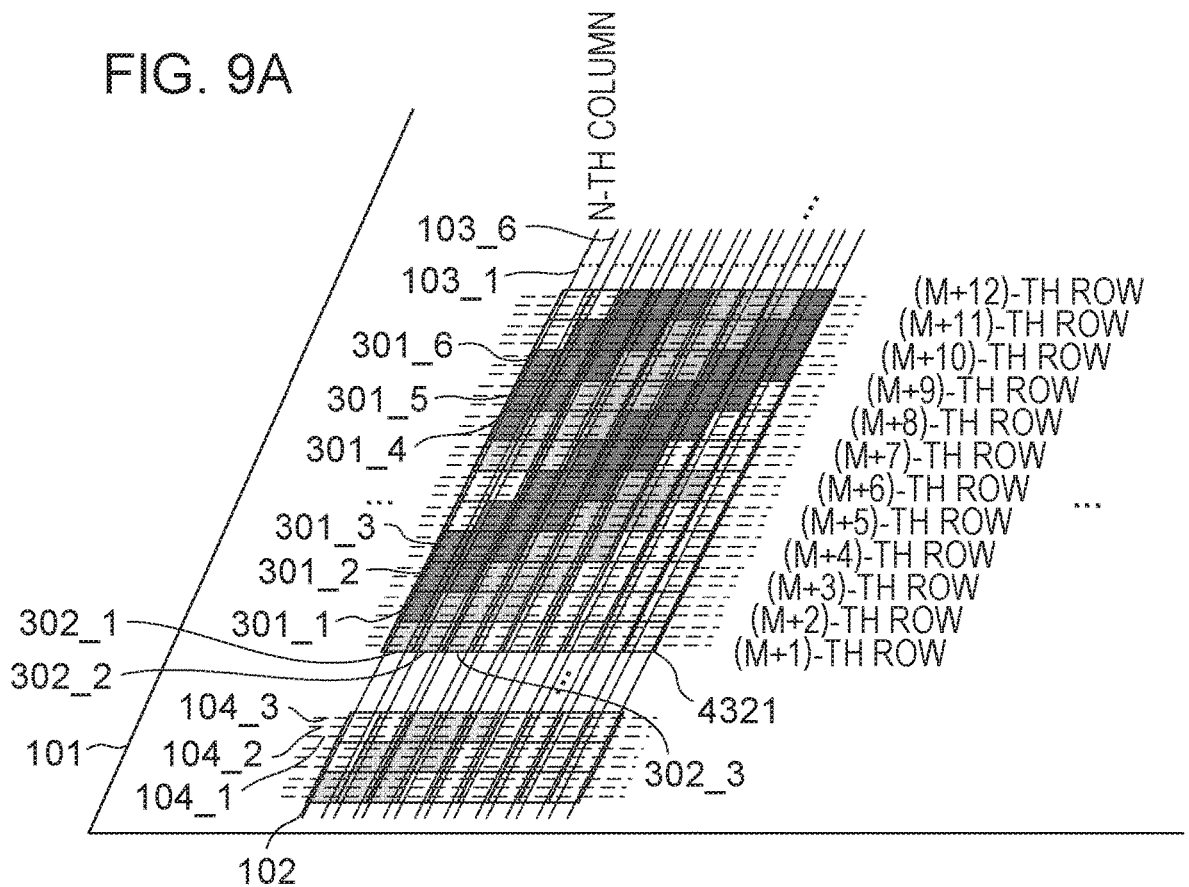
FIG. 9A schematically illustrates a semiconductor apparatus according to a fourth example.
Figure 9B:
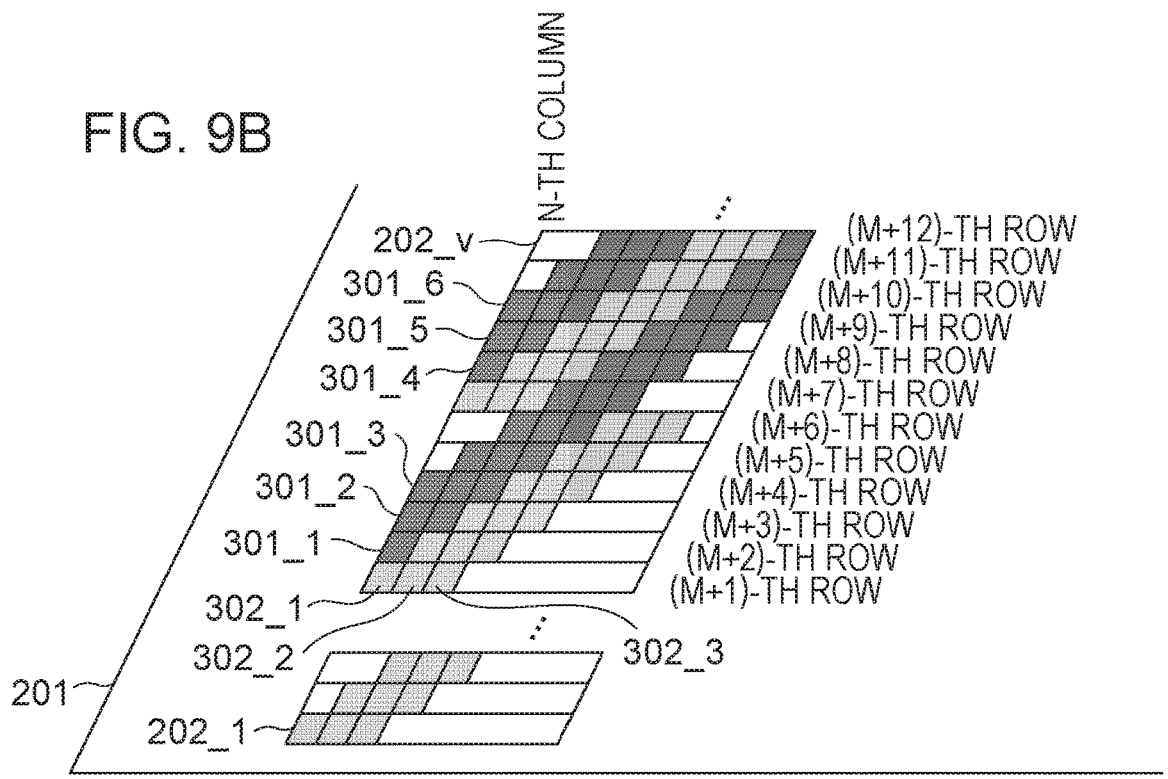
FIG. 9B schematically illustrates the semiconductor apparatus according to the fourth example.

The fourth example will be described with reference to FIGS. 9A to 9C. In FIGS. 9A to 9C, parts corresponding to FIGS. 6A to 6C are denoted by the same reference numerals and will be omitted from description. The relationship among FIGS. 9A, 9B, and 9C is substantially the same as the relationship among FIGS. 6A, 6B, and 6C.

In the fourth example, as the column wiring 103, six connection lines, which are column wirings 103_1 to 103_6, are provided in the same column. In addition, six column pads 301_1 to 301_6 connect the processing circuit 203 and the six column wirings 103_1 to 103_6.

Cells connected to the row pads 302_1 to 302_3 in an (M+m)-th row and cells connected to the row pads 302_1 to 302_3 in an (M+m+6)-th row are connected to the same column wiring 103_*m*. Herein, m is any of 1 to 6. Cells connected to the row pads 302_1 to 302_3 in the (M+1)-th row (m=1) and cells connected to the row pads 302_1 to 302_3 in the (M+7)-th row (m=1) are connected to the same column wiring 103_1 (m=1). Cells connected to the row pads 302_1 to 302_3 in the (M+2)-th row (m=2) and cells connected to the row pads 302_1 to 302_3 in the (M+8)-th row (m=2) are connected to the same column wiring 103_2 (m=2). Cells connected to the row pads 302_1 to 302_3 in the (M+3)-th row (m=3) and cells connected to the row pads 302_1 to 302_3 in the (M+9)-th row (m=3) are connected to the same column wiring 103_3 (m=3). Cells connected to the row pads 302_1 to 302_3 in the (M+4)-th row (m=4) and cells connected to the row pads 302_1 to 302_3 in the (M+10)-th row (m=4) are connected to the same column wiring 103_4 (m=4). Cells connected to the row pads 302_1 to 302_3 in the (M+5)-th row (m=5) and cells connected to the row pads 302_1 to 302_3 in the (M+11)-th row (m=5)

are connected to the same column wiring 103_5 (m=5). Cells connected to the row pads 302_1 to 302_3 in the (M+6)-th row (m=6) and cells connected to the row pads 302_1 to 302_3 in the (M+12)-th row (m=6) are connected to the same column wiring 103_6 (m=6).

In FIG. 9C, locations of the column pads 301_1 to 301_6 connected to the respective column wirings 103_1 to 103_6 are denoted by "a", "b", "c", "d", "e", and "f". In FIG. 9C, "c" denotes, for example, the location of the column pad 301_3 connected to the column wiring 103_3, and "d" denotes, for example, the location of the column pad 301_4 connected to the column wiring 103_4. In FIG. 9C, "e" denotes, for example, the location of the column pad 301_5 connected to the column wiring 103_5, and "f" denotes, for example, the location of the column pad 301_6 connected to the column wiring 103_6.

The arrangement of the column pads 301_1 to 301_6 and the row pads 302_1 to 302_3 in this example will be described.

The row pads 302_1 to 302_3 connected to the row wirings 104_1 to 104_3 corresponding to the same cell row are arranged in the same pad row. For example, in the (M+1)-th row, the row pads 302_1 to 302_3 are arranged in the N-th to (N+2)-th columns. In the (M+6)-th row, the row pads 302_1 to 302_3 are arranged in the (N+5)-th to (N+7)-th columns.

The row pads 302_1 to 302_3 in several (two in this example) pad rows are arranged in the same pad columns. In addition, the arrangement of the row pads 302_1 to 302_3 in a certain pad row is repeated in every seven pad rows (in a six-row cycle). For example, in the (M+7)-th row, the row pads 302_1 to 302_3 are arranged in the N-th to (N+2)-th columns as in the (M+1)-th row. In the (M+12)-th row, the row pads 302_1 to 302_3 are arranged in the (N+5)-th to (N+7)-th columns as in the (M+6)-th row.

The column pads 301_1 to 301_6 connected to the column wirings 103_1 to 103_6 corresponding to the same cell column are arranged in the same pad column. For example, in the N-th column, the column pads 301_1 to 301_3 are arranged in the (M+2)-th to (M+4)-th rows, and the column pads 301_4 to 301_6 are arranged in the (M+8)-th to (M+10)-th rows. In the (N+1)-th column, the column pads 301_1 to 301_3 are arranged in the (M+3)-th to (M+5)-th rows, and the column pads 301_4 to 301_6 are arranged in the (M+9)-th to (M+11)-th rows. In the (N+5)-th column, the column pads 301_1 to 301_3 are arranged in the (M+7)-th to (M+9)-th rows, and the column pads 301_4 to 301_6 are arranged in the (M+1)-th to (M+3)-th rows.

The column pads 301_1 to 301_6 in several (two in this example) pad columns are arranged in the same pad rows. In addition, the arrangement of the column pads 301_1 to 301_6 in a certain pad column is repeated in every seven pad columns (in a six-column cycle). For example, in the (N+6)-th and (N+12)-th columns, the column pads 301_1 to 301_3 are arranged in the (M+2)-th to (M+4)-th rows, and the column pads 301_4 to 301_6 are arranged in the (M+8)-th to (M+10)-th rows as in the N-th column. In the (N+7)-th column, the column pads 301_1 to 301_3 are arranged in the (M+3)-th to (M+5)-th rows, and the column pads 301_4 to 301_6 are arranged in the (M+9)-th to (M+11)-th rows as in the (N+1)-th column. In this manner, the row pads 302_1 to 302_3 are arranged in the same pad columns in the (M+1)-th and (M+7)-th rows, in the (M+2)-th and (M+8)-th rows, in the (M+3)-th and (M+9)-th rows, in the (M+4)-th and (M+10)-th rows, in the (M+5)-th and (M+11)-th rows, and in the (M+6)-th and (M+12)-th rows.

Now, several row wirings 104 to which several row pads 302 arranged in the same pad column are connected are focused. Among cells connected to such several row wirings 104, several cells belonging to the same cell column are connected to the same column wiring 103.

More specifically, two row wirings 104_1 to which the row pads 302_1 in the (M+m)-th row and the (M+m+6)-th row arranged in the same (N+m−1)-th column are connected are focused. Among cells connected to such two row wirings 104_1, several cells belonging to the same cell row are connected to the same column wiring 103_m.

In an example where m=1, two row wirings 104_1 to which the row pads 302_1 in the (M+1)-th row and the (M+7)-th row arranged in the same N-th column are connected are focused. Among cells connected to such two row wirings 104_1, several cells belonging to the same cell column are connected to the same column wiring 103_1.

Similarly, in an example where m=2, several row wirings 104_1 to which the row pads 302_1 in the (M+2)-th row and the (M+8)-th row arranged in the same (N+1)-th column are connected are focused. Among cells connected to such two row wirings 104_1, several cells belonging to the same cell column are connected to the same column wiring 103_2.

In other words, if several cells connected to the same column wiring 103 are focused, the row pads 302 connected to several row wirings 104 corresponding to such several cells are arranged in the same pad column.

More specifically, if two cells connected to the same column wiring 103_m are focused, the row pad 302_1 in the (M+m)-th row and the row pad 302_1 in the (M+m+6)-th row are connected to two row wirings 104_m corresponding to such two cells. The row pad 302_1 in the (M+m)-th row and the row pad 302_1 in the (M+m+6)-th row are arranged in the same (N+m)-th column.

In an example where m=1, if two cells connected to the same column wiring 103_1 are focused, the row pad 302_1 in the (M+1)-th row and the row pad 302_1 in the (M+7)-th row are connected to two row wirings 104_1 corresponding to such two cells. The row pad 302_1 in the (M+1)-th row and the row pad 302_1 in the (M+7)-th row are arranged in the same N-th column.

Similarly, in an example where m=2, if two cells connected to the same column wiring 103_2 are focused, the row pad 302_1 in the (M+2)-th row and the row pad 302_1 in the (M+8)-th row are connected to two row wirings 104_1 corresponding to such two cells. The row pad 302_1 in the (M+2)-th row and the row pad 302_1 in the (M+8)-th row are arranged in the same (N+1)-th column.

In addition, in an example where m=6, if two cells connected to the same column wiring 103_6 are focused, the row pad 302_1 in the (M+6)-th row and the row pad 302_1 in the (M+12)-th row are connected to two row wirings 104_1 corresponding to such two cells. The row pad 302_1 in the (M+6)-th row and the row pad 302_1 in the (M+12)-th row are arranged in the same (N+6)-th column.

In this manner, by arranging, in the same pad column, several row pads 302 connected to several row wirings 104 connected several cells connected to the same column wiring 103, differences in wiring path lengths from the several row pads 302 to the several cells can be reduced. As a result, differences in the operation of the several cells connected to the same row wirings 104 can be reduced, and variations in outputs of the several cells can be reduced.

This corresponds to the description with reference to FIG. 4A. That is, straight line O corresponds to one cell column. In addition, arrangement of several row pads 302 corresponding to the same column wiring 103 in the same pad column corresponds to reduction in the difference between distance P and distance Q or the difference between distance S and distance T.

Furthermore, if several column pads 301 arranged in the same pad column are focused, wiring path lengths from cells connected to each of the column pads 301 to a corresponding row pad 302 differ according to the pad row in which the column pad 301 is arranged.

More specifically, two column pads 301_m and 301_n arranged in the same (N+m−1)-th column are focused. Herein, n is any of 1 to 6 different from m. A row pad 302_m corresponding to a cell connected to the column pad 301_m is arranged in the (M+m)-th row in the (N+m−1)-th column. A row pad 302_1 corresponding to a cell connected to the column pad 301_n is arranged in the (M+n)-th row in the (N+n−1)-th column. Herein, a wiring path length from a cell connected to the column pad 301_2 to the row pad 302_1 in the (M+n)-th row in the (N+n−1)-th column is referred to as length J, and a wiring path length from a cell connected to the column pad 301_1 to the row pad 302_1 in the (M+m)-th row in the (N+m−1)-th column is referred to as length K. Length J is longer than length K by |n−m| pad columns.

As an example in which m=1 and n=2, two column pads 301_1 and 301_2 arranged in the same N column are focused. The row pad 302_1 corresponding to a cell connected to the column pad 301_1 is arranged in the (M+1)-th row in the N-th column.

The row pad 302_1 corresponding to a cell connected to the column pad 301_2 is arranged in the (M+2)-th row in the (N+1)-th column. Thus, the wiring path length from the cell connected to the column pad 301_2 to the row pad 302_1 in the (M+2)-th row in the (N+1)-th column is longer than the wiring path length from the cell connected to the column pad 301_1 to the row pad 302_1 in the (M+1)-th row in the N-th column by one pad column.

As an example in which m=1 and n=6, two column pads 301_1 and 301_6 arranged in the same N column are focused. The row pad 302_1 corresponding to a cell connected to the column pad 301_1 is arranged in the (M+1)-th row in the N-th column.

The row pad 302_6 corresponding to a cell connected to the column pad 301_2 is arranged in the (M+6)-th row in the (N+5)-th column. Thus, the wiring path length from the cell connected to the column pad 301_2 to the row pad 302_1 in the (M+2)-th row in the (N+1)-th column is longer than the wiring path length from the cell connected to the column pad 301_1 to the row pad 302_1 in the (M+1)-th row in the N-th column by five pad columns.

The row pads 302_1 to 302_3 are arranged in the same pattern in every seven pad rows (in a six-row cycle). In addition, the row pads 302_1 to 302_3 in the (M+2)-th and (M+8)-th rows corresponding to the row wirings 104 connected to two cells connected to the same column wiring 103 (e.g., the column wiring 103_1) are arranged in the same pad columns (the (N+1)-th to (N+3)-th columns).

More specifically, in each of the (M+2)-th and (M+8)-th rows, similarly, the row pad 302_1 is arranged in the (N+1)-th column, the row pads 302_2 is arranged in the (N+2)-th column, and the row pads 302_3 is arranged in the (N+3)-th column.

The row pads 302_1 to 302_3 connected to cells connected to the column wirings 103_1 to 103_6 are arranged in different pad columns. Thus, in each cell row in the six-row cycle, the wiring path length from the row pads 302_1 to 302_3 to the cells differ for each of the column wirings 103_1 to 103_6. As a result, fixed pattern noise in the six-row cycle may be generated. For example, in a row connected to the column wiring 103_1, if the row pads 302_1 are arranged in the same column, the path length of a signal line (row wiring 104_1) for transmitting a reset signal PRES differs in each row in the six-row cycle, and the fixed pattern noise in the six-row cycle may be generated. However, such fixed pattern noise in the six-row cycle may be canceled by performing a predetermined correction process by using a signal from a correction cell (e.g., optical black cell) formed in the periphery of the cell array.

Although the above example has illustrated a case of three row wirings 104_1 to 104_3 and six column wirings 103_1 to 103_6, the present invention is not limited to this relationship.

Fifth Example

Figure 10A:
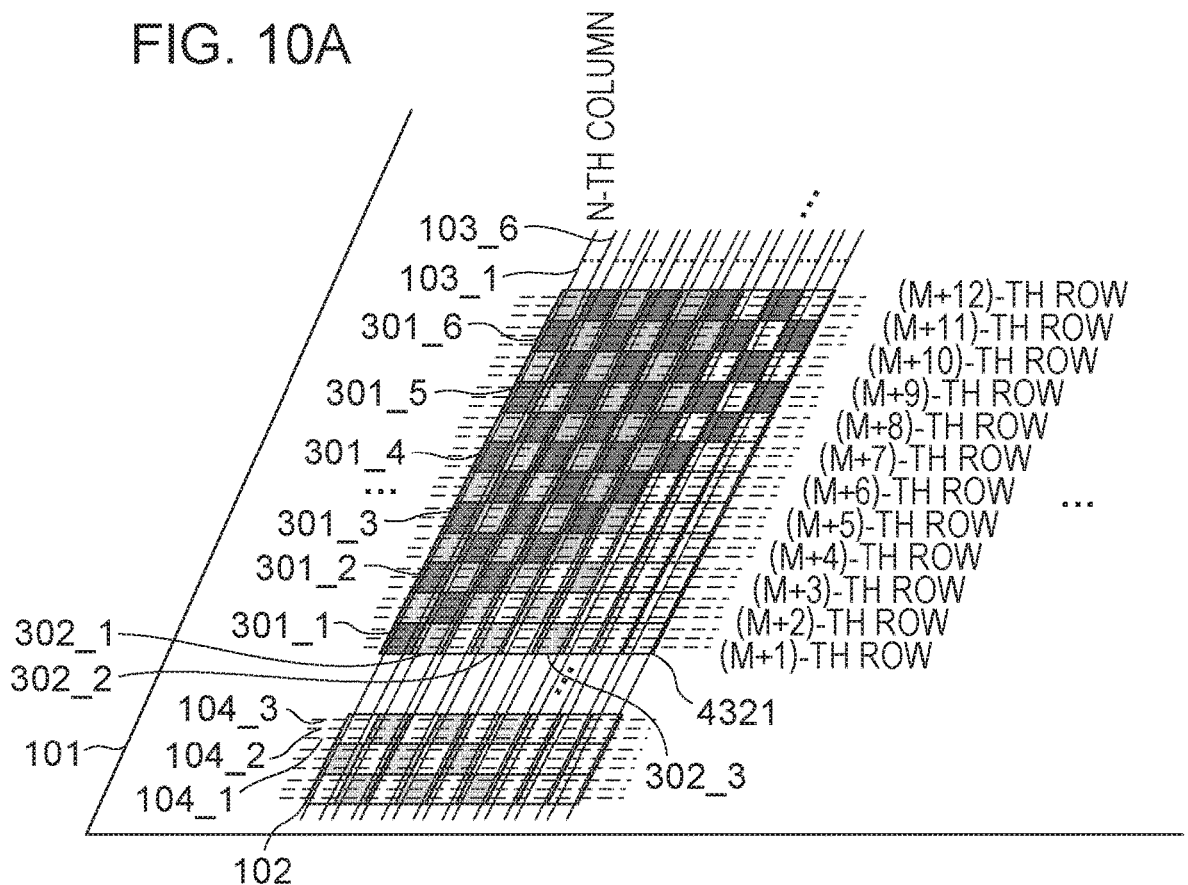
FIG. 10A schematically illustrates a semiconductor apparatus according to a fifth example.
Figure 10B:
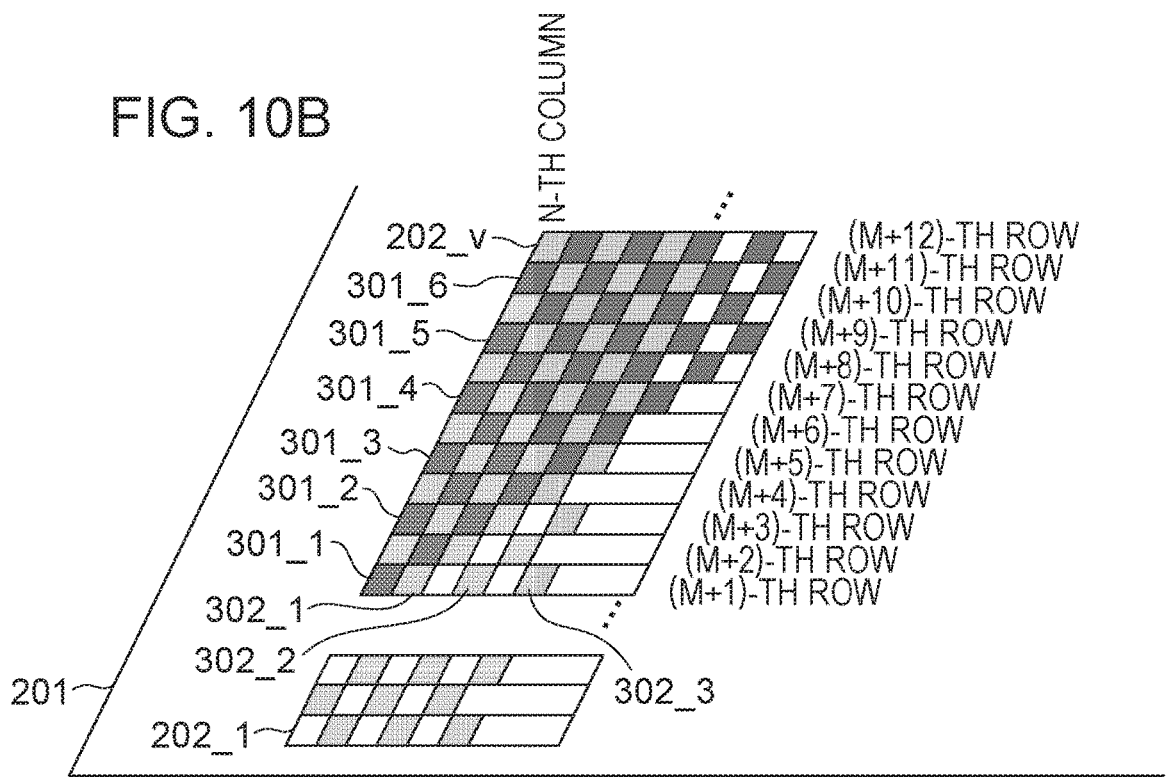
FIG. 10B schematically illustrates the semiconductor apparatus according to the fifth example.

The fifth example will be described with reference to FIGS. 10A to 10C. In the fifth example, parts that may be substantially the same as those in the fourth example will be omitted from description. Note that the relationship among FIGS. 10A, 10B, and 10C is substantially the same as the relationship among FIGS. 9A, 9B, and 9C.

The arrangement of the column pads 301_1 to 301_6 and the row pads 302_1 to 302_3 in this example will be described.

As in the fourth example, the row pads 302_1 to 302_3 connected to the row wirings 104_1 to 104_3 corresponding to the same cell row are arranged in the same pad row.

The row pads 302_1 to 302_3 in several (six in this example) pad rows are arranged in the same pad columns. In addition, the arrangement of the row pads 302_1 to 302_3 in a certain pad row is repeated in every other pad row (in a two-row cycle). For example, in the (M+1)-th, (M+3)-th, (M+5)-th, (M+7)-th, (M+9)-th, and (M+11)-throws, the row pads 302_1 to 302_3 are arranged in the N-th, (N+2)-th, and (N+4)-th columns. In addition, in the (M+2)-th, (M+4)-th, (M+6)-th, (M+8)-th, (M+10)-th, and (M+12)-th rows, the row pads 302_1 to 302_3 are arranged in the (N+1)-th, (N+3)-th, and (N+5)-th columns.

As in the fourth example, the column pads 301_1 to 301_6 connected to the column wirings 103_1 to 103_6 corresponding to the same cell column are arranged in the same pad column.

The column pads 301_1 to 301_6 in several (six in this example) pad columns are arranged in the same pad rows. In addition, the arrangement of the column pads 301_1 to 301_6 in a certain pad column is repeated in every other pad column (in a two-column cycle). For example, in the (N)-th, (N+2)-th, (N+4)-th, (N+6)-th, (N+8)-th, (N+10)-th, and (N+12)-th columns, the column pads 301_1 to 301_6 are arranged in the (M+1)-th, (M+3)-th, (M+5)-th, (M+7)-th, (M+9)-th, and (M+11)-th rows. In the (N+1)-th, (N+3)-th, (N+5)-th, (N+7)-th, (N+9)-th, and (N+11)-th columns, the column pads 301_1 to 301_6 are arranged in the (M+2)-th, (M+4)-th, (M+6)-th, (M+8)-th, (M+10)-th, and (M+12)-th rows.

Also in this example, fixed pattern noise in the two-row cycle may be generated for the same reason as in the fourth example. As in the fourth example, the fixed pattern noise may be canceled by performing a predetermined correction process. In addition, since the fixed pattern noise has the two-row cycle, the fixed pattern noise has a high spatial frequency, and image quality degradation may be suppressed as compared with the fourth example. Thus, the correction process is not always necessary.

Although the above example has illustrated a case of three row wirings 104_1 to 104_3 and six column wirings 103_1 to 103_6, this example is similarly applicable as long as the number of column wirings is one or any even number.

The above-described embodiment may be modified as appropriate without departing from the spirit of the present invention.

Figure 11:
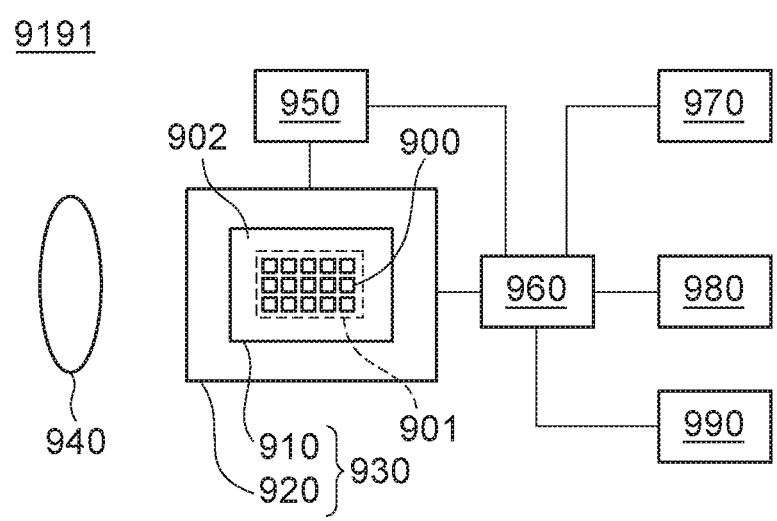
FIG. 11 schematically illustrates a semiconductor apparatus and equipment.

Now, equipment 9191 including the semiconductor apparatus 930 will be described in detail with reference to FIG. 11. The semiconductor apparatus 930 can include a semiconductor device 910 including the semiconductor layer 100 as described above and also a package 920 that accommodates the semiconductor device 910. The package 920 can include a base on which the semiconductor device 910 is fixed and a lid that is formed of glass, for example, and that faces the semiconductor device 910. The package 920 can further include a bonding member such as a bonding wire or bump that connects a terminal provided on the base and a terminal provided on the semiconductor device 910.

The equipment 9191 may include at least any of an optical apparatus 940, a control apparatus 950, a processing apparatus 960, a display apparatus 970, a storage apparatus 980, and a machine apparatus 990. The optical apparatus 940 corresponds to the semiconductor apparatus 930. For example, the optical apparatus 940 is a lens, a shutter, or a mirror. The control apparatus 950 controls the semiconductor apparatus 930. For example, the control apparatus 950 is a semiconductor apparatus such as application specific integrated circuit (ASIC).

The processing apparatus 960 processes signals output from the semiconductor apparatus 930. The processing apparatus 960 is a semiconductor apparatus such as a central processing unit (CPU) or an ASIC for configuring an analog front end (AFE) or a digital front end (DFE). The display apparatus 970 is an EL display apparatus or a liquid crystal display apparatus that displays information (image) obtained by the semiconductor apparatus 930. The storage apparatus 980 is a magnetic device or a semiconductor device that stores information (image) obtained by the semiconductor apparatus 930. The storage apparatus 980 is a volatile memory, such as an SRAM or a DRAM, or a non-volatile memory, such as a flash memory or a hard disk drive.

The machine apparatus 990 includes a movable unit or a propelling unit, such as a motor or an engine. The equipment 9191 displays signals output from the semiconductor apparatus 930 on the display apparatus 970 or externally transmits the signals by using a communication apparatus (not illustrated) included in the equipment 9191. Thus, the equipment 9191 may further include the storage apparatus 980 or the processing apparatus 960 in addition to a storage circuit or an arithmetic circuit included in the semiconductor apparatus 930. The machine apparatus 990 may be controlled on the basis of signals output from the semiconductor apparatus 930.

In addition, the equipment 9191 is suitable for electronic equipment such as an information terminal having an image capturing function (e.g., a smartphone or a wearable terminal) or a camera (e.g., a lens interchangeable camera, a compact camera, a video camera, or a monitoring camera). The machine apparatus 990 in a camera can drive components of the optical apparatus 940 for zooming, focusing, or shuttering. Alternatively, the machine apparatus 990 in a camera can move the semiconductor apparatus 930 for preventing blur.

The equipment 9191 may also be transport equipment, such as a vehicle, a ship, or an aircraft. The machine apparatus 990 in the transport equipment may be used as a moving apparatus. The equipment 9191 serving as transport equipment is suitable for transporting the semiconductor apparatus 930, or assisting and/or automating driving (operation) by using an image capturing function. The processing apparatus 960 for assisting and/or automating driving (operation) can perform processing for operating the machine apparatus 990 serving as a moving apparatus on the basis of information obtained by the semiconductor apparatus 930. Alternatively, the equipment 9191 may be medical equipment such as an endoscope, measuring equipment such as a distance measuring sensor, analyzing equipment such as an electron microscope, or office equipment such as a copier.

According to this embodiment, characteristics of wiring between the semiconductor component 101 and the semiconductor component 201 can be improved. Thus, the value of the semiconductor apparatus can be increased. The increase in value herein corresponds to at least any of addition of functions, improvement in performance, improvement in characteristics, increase in reliability, increase in yield rate, reduction in environmental load, reduction in cost, reduction in size, and reduction in weight.

Thus, by using the semiconductor apparatus according to this embodiment for equipment, the value of the equipment can also be increased. For example, the semiconductor apparatus can be mounted on transporting equipment, and high performance can be obtained when the transporting equipment captures an outside image or measures outside environment. Thus, a decision to mount the semiconductor apparatus according to this embodiment on transporting equipment is advantageous in increasing the performance of the transporting equipment for manufacturing and selling the transporting equipment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-116386, filed Jun. 24, 2019, which is hereby incorporated by reference herein in its entirety.

What is claimed is:

1. A semiconductor apparatus comprising:
a first semiconductor component comprising a cell array, a first plurality of pads and a plurality of wirings; and
a second semiconductor component comprising a second plurality of pads connected to the first semiconductor component,
wherein the first semiconductor component and the second semiconductor component overlap with each other, the first plurality of pads of the first semiconductor component and the second plurality of pads of the second semiconductor component are directly bonded at a joint surface and first insulating member of the first semiconductor component and an second insulating member of the second semiconductor component are directly bonded at the joint surface,
wherein the cell array comprises a plurality of cells arranged in a first direction and a second direction that crosses the first direction,
wherein the first plurality of pads and the second plurality of pads are arranged on a plane along the first direction and the second direction to overlap with the cell array,
wherein the plurality of cells comprises
a first cell,
a second cell that is arranged next to the first cell in the first direction,
a third cell that is arranged next to the first cell in the second direction, and a fourth cell that is arranged next to the third cell in the first direction and next to the second cell in the second direction, wherein the plurality of wirings comprises
- a first wiring connected to the first cell and the second cell,
- a second wiring connected to the third cell and the fourth cell, and
- a third wiring connected to the first cell and the third cell, wherein the second plurality of pads comprises
- a first pad connected to the first wiring,
- a second pad connected to the second wiring, and
- a third pad connected to the third wiring, and wherein the first pad, the second pad, and the third pad are arranged such that a first straight line passing through the first pad and the third pad crosses a second straight line connecting the second pad and the third pad.

2. The semiconductor apparatus according to claim 1, wherein the plurality of wirings comprises a fourth wiring connected to the second cell and a cell that is next to the second cell in the second direction, wherein the second plurality of pads comprises a fourth pad connected to the fourth wiring, and wherein the first pad, the second pad, the third pad, and the fourth pad are arranged such that a third straight line connecting the first pad and the second pad passes through the third pad and the fourth pad and/or that a fourth straight line passing through the third pad and the fourth pad passes through the first pad and the second pad.

3. The semiconductor apparatus according to claim 1, wherein the plurality of cells comprises
- a fifth cell that is next to the first cell and the third cell in the second direction, and
- a sixth cell that is next to the fifth cell in the first direction and next to the second cell and the fourth cell in the second direction, wherein the plurality of wirings comprises a fifth wiring connected to the fifth cell and the sixth cell, wherein the second plurality of pads comprises a fifth pad connected to the fifth wiring, and wherein the first pad, the second pad, the third pad, and the fifth pad are arranged such that a third straight line passing through the first pad and the second pad crosses a fourth straight line passing through the third pad and the fifth pad.

4. The semiconductor apparatus according to claim 1, wherein the plurality of cells comprises
- a fifth cell that is next to the first cell and the third cell in the second direction, and
- a sixth cell that is next to the fifth cell in the first direction and next to the second cell and the fourth cell in the second direction, wherein the plurality of wirings comprises a fifth wiring connected to the fifth cell and the sixth cell, wherein the second plurality of pads comprises a fifth pad connected to the fifth wiring, and wherein a third straight line passing through the second pad and the fifth pad crosses a fourth straight line passing through the first pad and the second pad.

5. The semiconductor apparatus according to claim 1, wherein the plurality of cells comprises
- a fifth cell that is next to the first cell and the third cell in the second direction, and
- a sixth cell that is next to the fifth cell in the first direction and next to the second cell and the fourth cell in the second direction, wherein the plurality of wirings comprises a fifth wiring connected to the fifth cell and the sixth cell, wherein the second plurality of pads comprises a fifth pad connected to the fifth wiring, and wherein the second pad is located between the first pad and the fifth pad.

6. The semiconductor apparatus according to claim 2, wherein the plurality of wirings comprises
- a first signal line connected to a first semiconductor element included in the first cell and a second semiconductor element included in the second cell, and
- a second signal line connected to a third semiconductor element included in the first cell and a fourth semiconductor element included in the second cell, wherein the second plurality of pads comprises
- a first connection pad connected to the first signal line, and
- a second connection pad connected to the second signal line, wherein the first wiring is the first signal line or the second signal line, wherein the first pad is the first connection pad or the second connection pad, and wherein the fourth pad is located between the first connection pad and the second connection pad.

7. The semiconductor apparatus according to claim 1, wherein the plurality of wirings comprises
- a first signal line connected to a first semiconductor element included in the first cell and a second semiconductor element included in the second cell, and
- a second signal line connected to a third semiconductor element included in the first cell and a fourth semiconductor element included in the second cell, wherein the second plurality of pads comprises
- a first connection pad connected to the first signal line, and
- a second connection pad connected to the second signal line, wherein the first wiring is the first signal line or the second signal line, wherein the first pad is the first connection pad or the second connection pad, and wherein the first connection pad is located between the third pad and the second connection pad.

8. The semiconductor apparatus according to claim 6, wherein the plurality of wirings comprises a third signal line connected to a semiconductor element included in the first cell and a semiconductor element included in the second cell, wherein the second plurality of pads comprises a third connection pad connected to the third signal line, and wherein the second connection pad is located between the first connection pad and the third connection pad.

9. The semiconductor apparatus according to claim 1, wherein the plurality of cells comprises
- a fifth cell that is next to the third cell in the second direction,
- a sixth cell that is next to the fifth cell in the first direction and next to the fourth cell in the second direction,
- a seventh cell that is next to the fifth cell in the second direction, and an eighth cell that is next to the seventh cell in the first direction and next to the sixth cell in the second direction, wherein the plurality of wirings comprises
- a fifth wiring connected to the fifth cell and the sixth cell,
- a sixth wiring connected to the seventh cell and the eighth cell, and
- a seventh wiring connected to the fifth cell and the seventh cell, and wherein the second plurality of pads comprises
- a fifth pad connected to the fifth wiring,
- a sixth pad connected to the sixth wiring, and
- a seventh pad connected to the seventh wiring.

10. The semiconductor apparatus according to claim 9, wherein a straight line connecting the third pad and the seventh pad is defined as a third straight line,
wherein a distance between the third straight line and the first pad is defined as a first distance,
wherein a distance between the third straight line and the second pad is defined as a second distance, and
wherein a difference between the first distance and the second distance is smaller than a distance between the first pad and the second pad.

11. The semiconductor apparatus according to claim 10, wherein a distance between the third straight line and the fifth pad is defined as a third distance,
wherein a distance between the third straight line and the sixth pad is defined as a fourth distance,
wherein a difference between the third distance and the fourth distance is smaller than a distance between the fifth pad and the sixth pad and is smaller than the distance between the first pad and the second pad, and
wherein the difference between the first distance and the second distance is smaller than the distance between the fifth pad and the sixth pad.

12. A semiconductor apparatus comprising:
a first semiconductor component comprising a cell array and a plurality of wirings; and
a second semiconductor component comprising a pad array connected to the first semiconductor component,
wherein the first semiconductor component and the second semiconductor component overlap with each other,
wherein the cell array comprises a plurality of cells arranged in matrix,
wherein the pad array comprises a plurality of pads arranged in matrix to overlap with the cell array,
wherein the plurality of wirings comprises
- a plurality of row wirings each connected to two or more cells in the same cell row of the cell array and provided in a corresponding cell row of the cell array, and
- a plurality of column wirings each connected to two or more cells in the same cell column of the cell array and provided in a corresponding cell column of the cell array, and wherein a first row pad connected to a first row wiring among the plurality of row wirings and a second row pad connected to a second row wiring among the plurality of row wirings are arranged in different pad columns of the pad array and wherein a third row pad connected to a third row wiring among the plurality of row wirings is arranged in the same pad column as the first row pad.

13. The semiconductor apparatus according to claim 12, wherein, in the pad array, in a first pad column including the first row pad connected to the first row wiring, a first pad is arranged to be connected to a first column wiring among the plurality of column wirings, and
wherein, in a second pad column including the second row pad connected to the second row wiring, a second pad is arranged to be connected to a second column wiring among the plurality of column wirings.

14. The semiconductor apparatus according to claim 12, wherein a fourth row pad connected to a fourth row wiring among the plurality of row wirings is arranged in the same pad column as the second row pad.

15. The semiconductor apparatus according to claim 12, wherein the plurality of cells comprises a predetermined number of cells connected to the same column wiring,
wherein the plurality of wirings comprises a predetermined number of row wirings respectively connected to the predetermined number of cells,
wherein the plurality of pads comprises a predetermined number of pads respectively connected to the predetermined number of row wirings, and
wherein the predetermined number of pads are arranged in the same pad column.

16. The semiconductor apparatus according to claim 15, wherein the predetermined number of pads are arranged in every two pad rows.

17. The semiconductor apparatus according to claim 12, wherein the plurality of wirings comprises a plurality of row wirings each connected to two or more cells in the same cell row,
wherein the plurality of pads comprises a predetermined number of row pads respectively connected to the plurality of row wirings, and
wherein the predetermined number of row pads are arranged in every other pad column.

18. The semiconductor apparatus according to claim 1, wherein the first pad and the third pad are arranged side by side in one of the first direction or the second direction, and the second pad and the third pad are arranged side by side in the other of the first direction and the second direction.

19. The semiconductor apparatus according to claim 1, wherein the second semiconductor component further comprises
control circuit means for controlling the cell array, and
processing circuit means for processing a signal output from the cell array,
wherein the first pad and the second pad are connected to the control circuit, and
wherein the third pad and the fourth pad are connected to the processing circuit.

20. The semiconductor apparatus according to claim 1, wherein each of the plurality of cells comprises a photoelectric conversion element.

21. An equipment comprising:
the semiconductor apparatus according to claim 1; and
at least any one of
an optical apparatus corresponding to the semiconductor apparatus,
controller for controlling the semiconductor apparatus,
processing apparatus for processing a signal output from the semiconductor apparatus,
display for displaying information obtained from the semiconductor apparatus,
storage for storing information obtained from the semiconductor apparatus, and
a device for operating based on information obtained from the semiconductor apparatus.

22. The semiconductor apparatus according to claim 19, wherein each of the plurality of cells comprises a photoelectric conversion element.

23. The semiconductor apparatus according to claim 1, wherein a first signal from the first semiconductor component to the second semiconductor component passes through the first pad and a second signal from the second semiconductor component to the first semiconductor component passes through the third pad.

24. The semiconductor apparatus according to claim 23, wherein the first signal from the first semiconductor component to the second semiconductor component is a signal output from the cell array, and the second signal from the second semiconductor component to the first semiconductor component is a signal for controlling the cell array.

* * * * *